United States Patent
Do et al.

(10) Patent No.: US 7,750,452 B2
(45) Date of Patent: Jul. 6, 2010

(54) SAME SIZE DIE STACKED PACKAGE HAVING THROUGH-HOLE VIAS FORMED IN ORGANIC MATERIAL

(75) Inventors: Byung Tai Do, Singapore (SG); Heap Hoe Kuan, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 79 days.

(21) Appl. No.: 11/768,869

(22) Filed: Jun. 26, 2007

(65) Prior Publication Data

US 2008/0272470 A1 Nov. 6, 2008

Related U.S. Application Data

(63) Continuation-in-part of application No. 11/744,657, filed on May 4, 2007, now Pat. No. 7,569,421.

(51) Int. Cl.
| | |
|---|---|
| H01L 23/495 | (2006.01) |
| H01L 23/02 | (2006.01) |
| H01L 23/34 | (2006.01) |
| H01L 23/04 | (2006.01) |
| H01L 23/48 | (2006.01) |
| H01L 23/52 | (2006.01) |
| H01L 29/40 | (2006.01) |
| H01L 23/29 | (2006.01) |

(52) U.S. Cl. ............... 257/686; 257/730; 257/E23.01; 257/E23.119; 257/E23.011; 257/777; 257/723; 257/676

(58) Field of Classification Search .............. 257/777, 257/787, 702, E23.007, E23.003, 704, 701, 257/E23.178, 698, 784, 773, 689, 686, 730, 257/E23.01, E23.119, E23.011, 723, 676
See application file for complete search history.

(56) References Cited

U.S. PATENT DOCUMENTS

| 5,694,551 | A | 12/1997 | Doyle et al. |
| 6,157,915 | A | 12/2000 | Bhaskaran et al. |
| 6,501,165 | B1 * | 12/2002 | Farnworth et al. .......... 257/686 |
| 7,132,747 | B2 * | 11/2006 | Kwon et al. ................ 257/724 |
| 7,215,033 | B2 * | 5/2007 | Lee et al. .................... 257/777 |
| 2002/0013721 | A1 | 1/2002 | Dabbiere et al. |
| 2002/0019761 | A1 | 2/2002 | Lidow |
| 2002/0042755 | A1 | 4/2002 | Kumar et al. |
| 2002/0049622 | A1 | 4/2002 | Lettich et al. |

* cited by examiner

*Primary Examiner*—Phat X Cao
*Assistant Examiner*—Diana C Garrity
(74) *Attorney, Agent, or Firm*—Robert D. Atkins

(57) ABSTRACT

A semiconductor package includes a substrate or leadframe structure. A plurality of interconnected dies, each incorporating a plurality of through-hole vias (THVs) disposed along peripheral surfaces of the plurality of dies, are disposed over the substrate or leadframe structure. The plurality of THVs are coupled to a plurality of bond pads through a plurality of a metal traces. A top surface of a first THV is coupled to a bottom surface of a second THV. An encapsulant is formed over a portion of the substrate or leadframe structure and the plurality of dies.

25 Claims, 27 Drawing Sheets

SAME SIZE DIE STACKED PACKAGE HAVING THROUGH-HOLE VIAS FORMED IN ORGANIC MATERIAL

CLAIM TO DOMESTIC PRIORITY

The present invention is a continuation-in-part application of U.S. patent application Ser. No. 11/744,657, filed May 4, 2007, entitled "Through-Hole Via on Saw Streets," and claims priority to the foregoing parent application pursuant to 35 U.S.C. §120.

CROSS-REFERENCE TO RELATED APPLICATIONS

The present application is related to co-pending U.S. application Ser. No. (Pending) entitled "Package-on-Package Using Through-Hole Via Die on Saw Streets," filed concurrently herewith, Ser. No. 11/768,844, and co-pending U.S. application Ser. No. (Pending), entitled "Package-in-Package Using Through-Hole Via on Saw Streets," filed concurrently herewith, Ser. No. 11/768,825.

FIELD OF THE INVENTION

The present invention relates in general to semiconductor devices and, more particularly, to a through-hole via (THV) stackable semiconductor device.

BACKGROUND OF THE INVENTION

In a growing trend, semiconductor manufacturers have increasingly adopted three-dimensional (3D) interconnects and packaging for semiconductor devices. Three-dimensional interconnects give advantages such as size reduction, reduced interconnect length and integration of devices with different functionality within a respective package.

One of the various ways of implementing 3D interconnects involves the use of THV technology. THVs can be located either within a semiconductor device, or die, or outside the die along a saw street guide.

However, current THV technology poses several limitations. A via located within a semiconductor device restricts the freedom of having additional circuitry within the semiconductor device. As can be appreciated, a respective location of a THV forecloses the placement of circuitry at that location. As a result, the functionality of the semiconductor device, and therefore, a device making use of the semiconductor device, is limited.

A via located outside the semiconductor device, i.e., along the saw street guide, necessitates a wider saw street to accommodate the creation of a through-hole. As a result, yields for semiconductor devices per wafer are reduced.

SUMMARY OF THE INVENTION

In light of the foregoing, the aim of the present invention is to provide a THV stackable semiconductor device, including packages incorporating stacked THV dies, without having any of the accompanying limitations previously described. In addition, the present invention utilizes the THV stackable semiconductor device technology to form same size stacked semiconductor packages.

Accordingly, in one embodiment, the present invention is a semiconductor package comprising a substrate or leadframe structure having an integrated cavity, a plurality of interconnected dies, each incorporating a plurality of THVs disposed along peripheral surfaces of the plurality of dies, disposed within a portion of the integrated cavity, the plurality of THVs coupled to a plurality of bond pads through a plurality of a metal traces, wherein a top surface of a first THV is coupled to a bottom surface of a second THV, and an encapsulant formed over a portion of the substrate or leadframe structure and the plurality of dies.

In another embodiment, the present invention is a semiconductor package comprising a substrate or leadframe structure, a plurality of interconnected dies, each incorporating a plurality of THVs disposed along peripheral surfaces of the plurality of dies, disposed over the substrate or leadframe structure, the plurality of THVs coupled to a plurality of bond pads through a plurality of metal traces, wherein a top surface of a first THV is coupled to a bottom surface of a second THV, and an encapsulant formed over a portion of the substrate or leadframe structure and the plurality of dies.

In another embodiment, the present invention is a method of manufacturing a semiconductor package comprising providing a substrate or leadframe structure having an integrated cavity, providing a plurality of interconnected dies, each incorporating a plurality of THVs disposed along peripheral surfaces of the plurality of dies, disposed within a portion of the integrated cavity, the plurality of THVs coupled to a plurality of bond pads through a plurality of metal traces, wherein a top surface of a first THV is coupled to a bottom surface of a second THV, and providing an encapsulant formed over a portion of the substrate or leadframe structure and the plurality of dies.

In another embodiment, the present invention is a method of manufacturing a semiconductor package comprising providing a substrate or leadframe structure, providing a plurality of interconnected dies, each incorporating a plurality of THVs disposed along peripheral surfaces of the plurality of dies, disposed over the substrate or leadframe structure, the plurality of THVs coupled to a plurality of bond pads through a plurality of a metal traces, wherein a top surface of a first THV is coupled to a bottom surface of a second THV, and providing an encapsulant formed over a portion of the substrate or leadframe structure and the plurality of dies.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

In the following description and claims, the terms "comprise" and "include," along with their derivatives, may be used and are intended as synonyms for each other. In addition, in the following description and claims, the terms "coupled"and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

Figure 1:
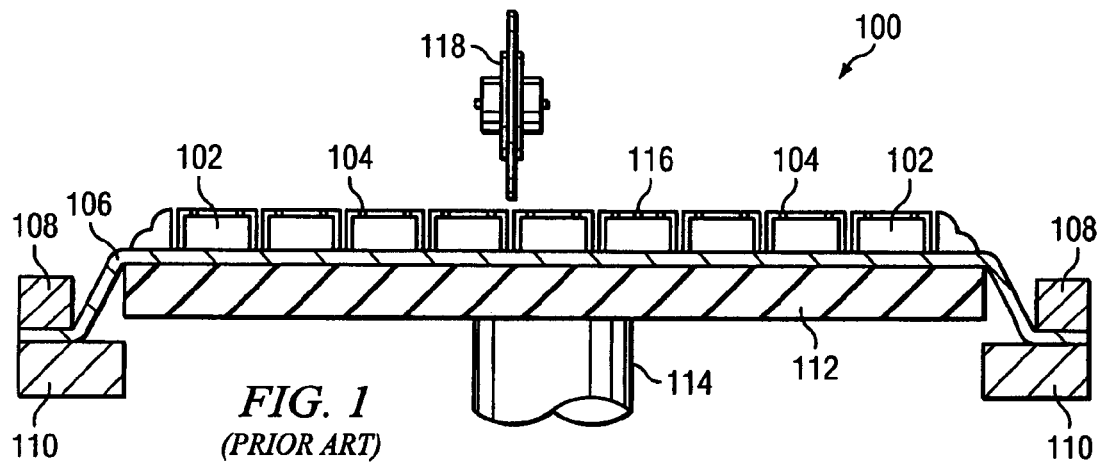
FIG. 1 illustrates an exemplary prior art method of making a wafer level chip scale package.

FIG. 1 illustrates an exemplary prior art method 100 of making a wafer level chip scale package. A plurality of semiconductor devices 102 are cut from a wafer. Each semiconductor device 102 has a plurality of protruding bonding pads 104 located on the active surface of semiconductor device 102.

The plurality of semiconductor devices 102 are disposed on the top surface of a retractable film 106. The retractable film 106 is secured by a frame 108. The frame 108 is fixed by a fixture 110 and retractable film 106 is displaced on a work platform 112 and then stretched.

The platform 112 can move up relative to fixture 110. The wafer is cut by a cutter into the plurality of semiconductor devices 102 as shown, which have been encapsulated into semiconductor packages and then sawn by cutter 118. A shaft 114 moves upward to lift platform 112 relative to fixture 110.

The present invention improves upon the exemplary prior art method 100 of manufacture to render a THV semiconductor device which is, in some embodiments, stacked together for specific applications and implementations.

Figure 2A:
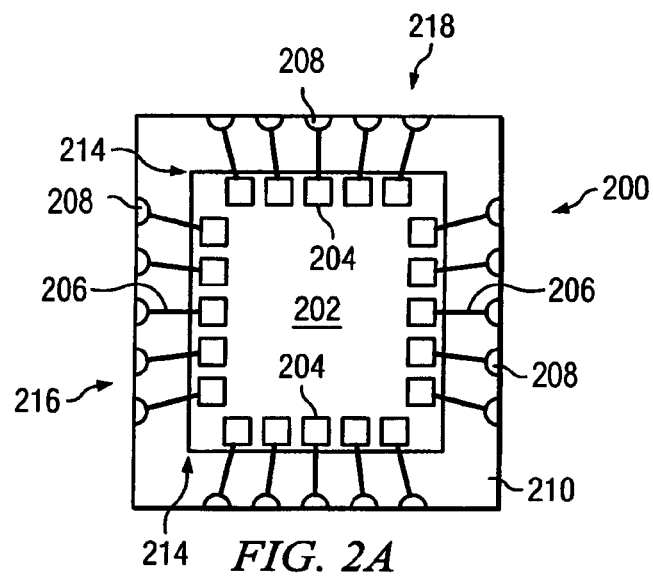
FIGS. 2A and 2B illustrate a first embodiment of a THV stackable semiconductor device in a top and side view, respectively.
Figure 2B:
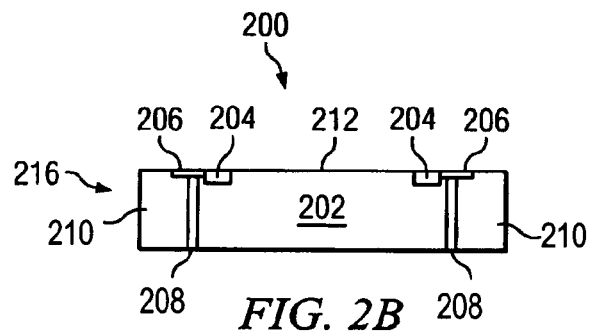

FIGS. 2A and 2B illustrate a first embodiment of a THV stackable semiconductor device 200, in a top and side view, respectively. Device 200 has an incorporated die 202. Device 200 includes a plurality of bond pads 204, which are deposited on an active side of semiconductor die 202. Bonding pads 204 can be deposited on the electrode terminals of die 202 by a plating process, or otherwise. The materials of bonding pads 204 can be made from a conductive metal, such aluminum (Al). Bonding pads 204 can be joined to a substrate by a soldering process.

A series of metal traces 206 electrically couple bond pads 204 to via 208. As shown in FIG. 2B, via 208 extends vertically from the active, top surface 212 of die 202 and surrounding material 210 to a bottom surface of the die and surrounding material 210, which is consistent with a THV design.

The surrounding material 210, which is, for purposes of the present invention, referred to as an "organic material", is deposited around peripheral surface 214 of die 202 as shown. The organic material 210 is an improvement and a departure from that of the prior art, as will be further described. The organic material can include such materials as benzocyclobutene (BCB), polyimide (PI), or similar material. As shown, vias 208 are formed in organic material 210 and organized according to rows. In the present embodiment 200, vias 208 are formed in each side of organic material 210, e.g., sides 216, and 218, so as to completely surround the periphery of die 202. Each of the plurality of bond pads 204 is electrically coupled to each of the plurality of vias 208.

As will be shown, THV 208 can be formed in various configurations, for example, along multiple rows. Further, half-cut vias as shown in the instant figure or complete, uncut vias can be formed in various embodiments to suit particular implementations. The semiconductor device 200 can be stacked or coupled with additional dies 202 in a variety of configurations.

Figure 3A:
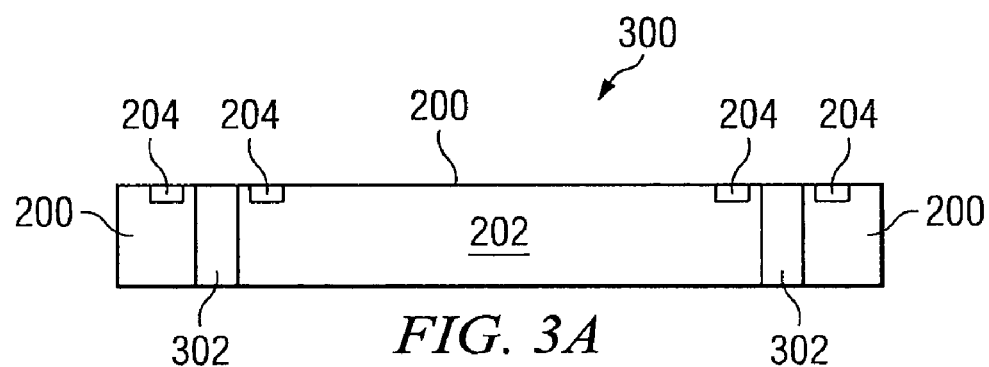
FIGS. 3A and 3B illustrate a first step in a first exemplary method of manufacturing the THV stackable semiconductor device as shown in FIGS. 2A and 2B in a side and top view, respectively.
Figure 3B:
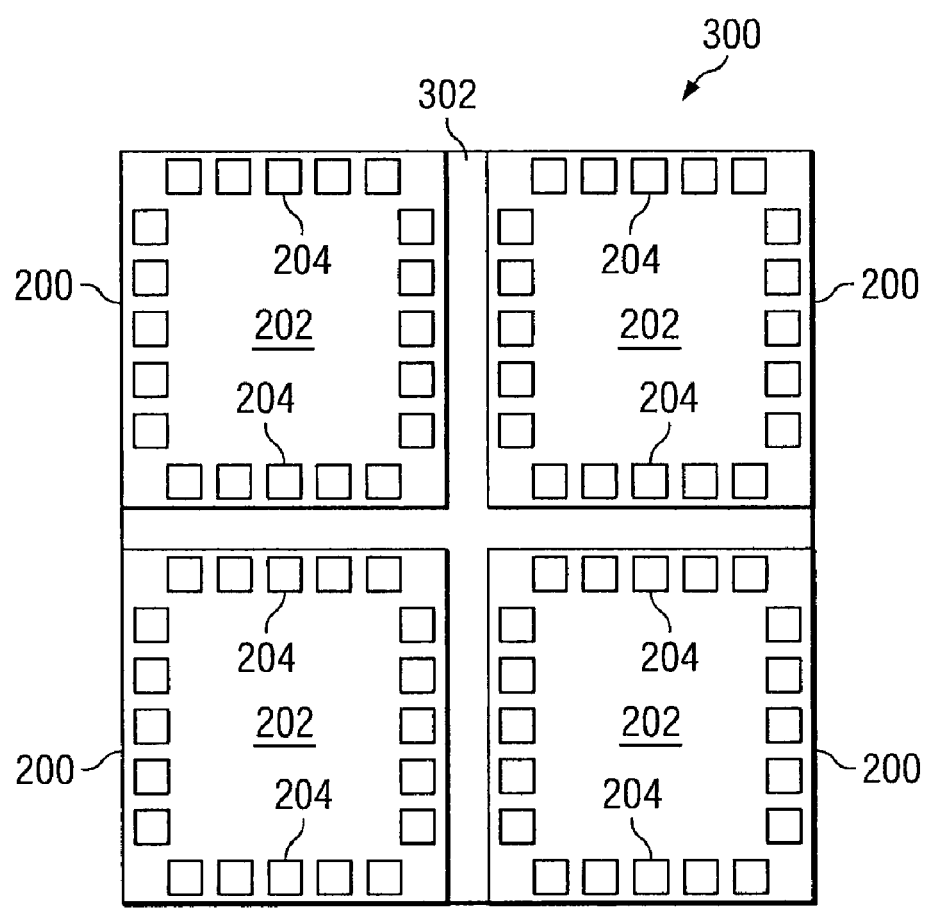

FIGS. 3A and 3B illustrate a first step in a first exemplary method of manufacturing the THV stackable semiconductor device as shown in FIGS. 2A and 2B in a side and top view, respectively. A series of bond pads 204 are formed on an active surface of wafer 300 as shown. The wafer is designated with a saw street guide 302.

Figure 4A:
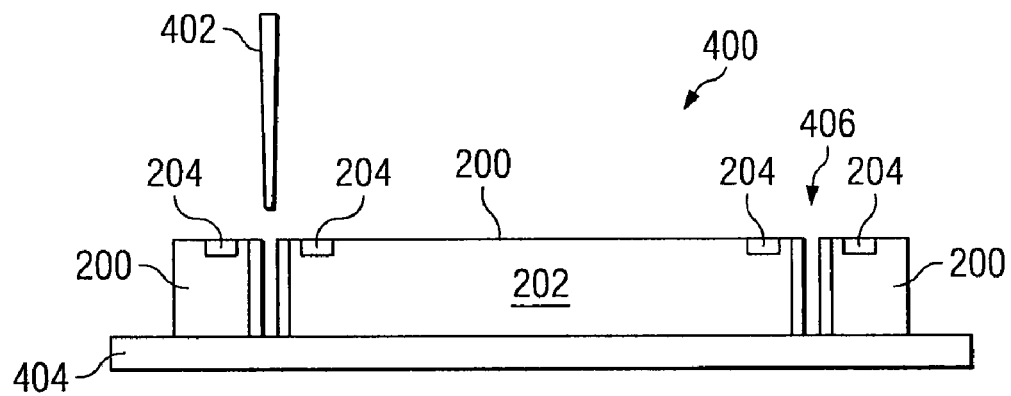
FIGS. 4A and 4B illustrate a second step in a first exemplary method of manufacturing the THV stackable semiconductor device as shown in FIGS. 2A and 2B in a side and top view, respectively.
Figure 4B:
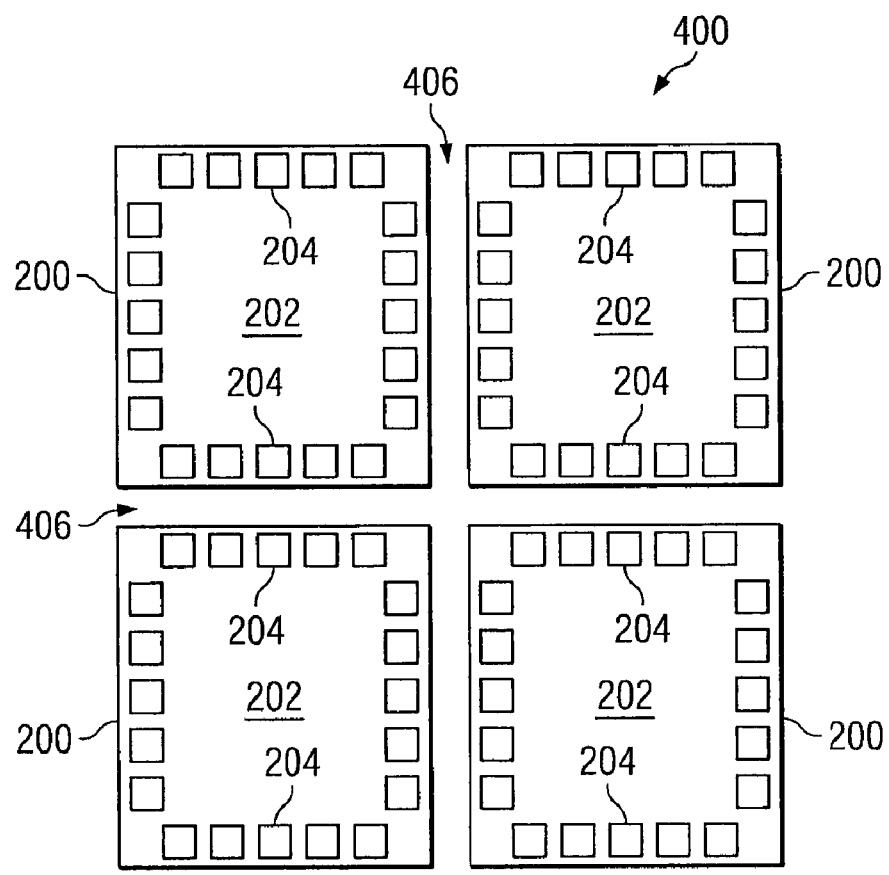

FIGS. 4A and 4B illustrate a second step in the first exemplary method of manufacturing the THV stackable semiconductor device as shown in FIGS. 2A and 2B in a side and top view, respectively. Wafer 300 is singulated into depicted pieces 400 by a cutting source 402. Cutting source 402 can include a saw or laser cutting tool.

Prior to singulation, wafer 300 is placed on a dicing tape 404, which keeps the various segments 400 in place during the singulation process. Subsequent to the singulation process, a series of gaps 406 is formed between respective segments 400 as shown.

Figure 5A:
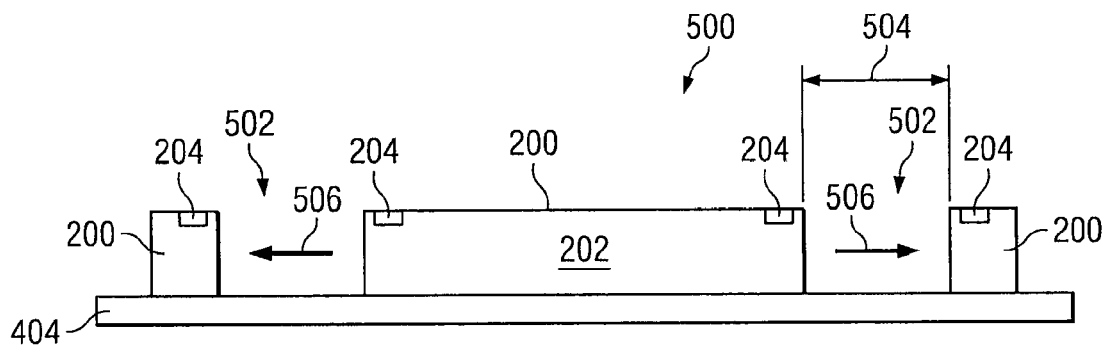
FIGS. 5A and 5B illustrate a third step in a first exemplary method of manufacturing the THV stackable semiconductor device as shown in FIGS. 2A and 2B in a side and top view, respectively.
Figure 5B:
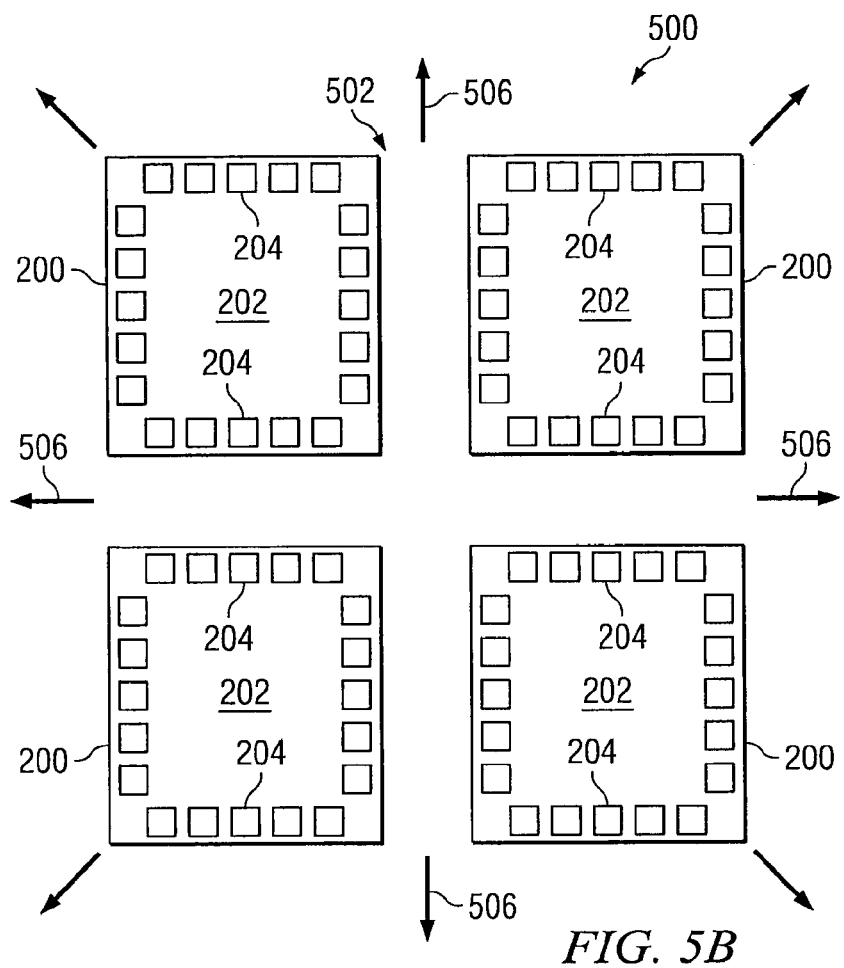

FIGS. 5A and 5B illustrate a third step in the first exemplary method of manufacturing the THV stackable semiconductor device as shown in FIGS. 2A and 2B in a side and top view, respectively. Wafer 300, in the depicted respective segments, undergoes an expansion process. The dicing tape 404 can be stretched by using an expansion table to render a series of gaps 502 having predetermined distances 504. The depicted arrows 506 indicate the various expansion directions undergone by the wafer expansion process.

Figure 6A:
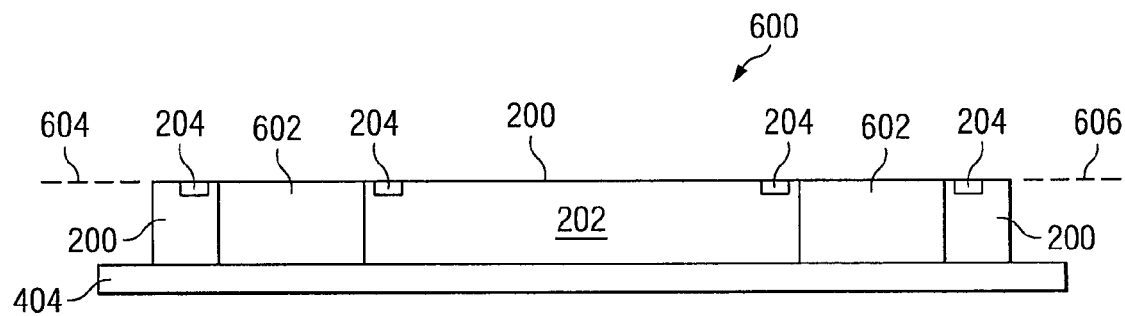
FIGS. 6A and 6B illustrate a fourth step in a first exemplary method of manufacturing the THV stackable semiconductor device as shown in FIGS. 2A and 2B in a side and top view, respectively.
Figure 6B:
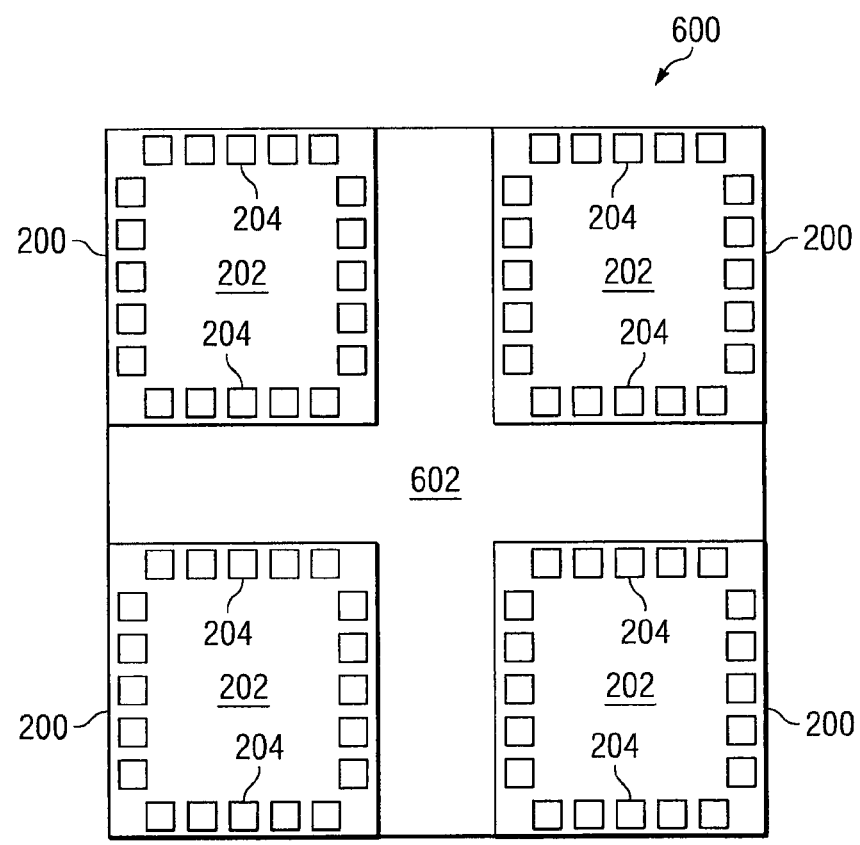

As a next step, FIGS. 6A and 6B illustrate a fourth step in the first exemplary method of manufacturing the THV stackable semiconductor device as shown in FIGS. 2A and 2B in a side and top view, respectively. The various gaps 502 shown in FIGS. 5A and 5B are filled with the previously described organic material 602. A plane 604 corresponding to a top surface of filled segments 600 is substantially coplanar with a plane 606 corresponding to a top surface of organic material 602.

The organic material 602 application can be performed by such methods as spin-coating, needle dispensing, or similar application.

Figure 7A:
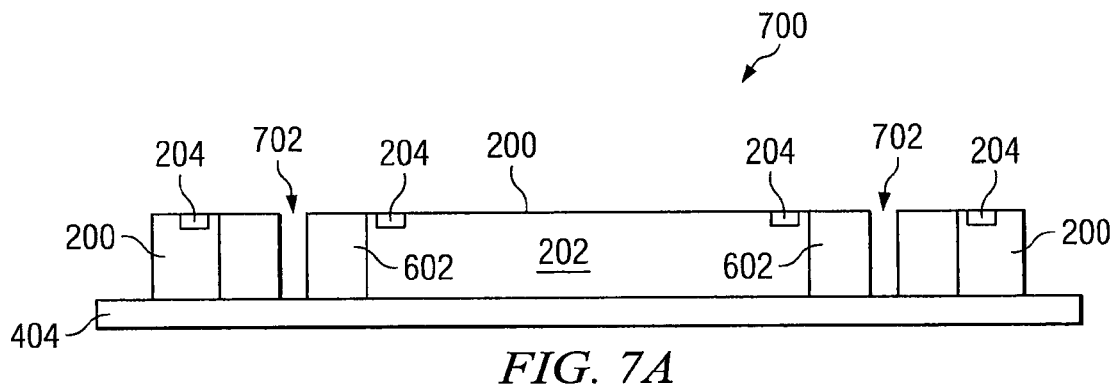
FIGS. 7A and 7B illustrate a fifth step in a first exemplary method of manufacturing the THV stackable semiconductor device as shown in FIGS. 2A and 2B in a side and top view, respectively.
Figure 7B:
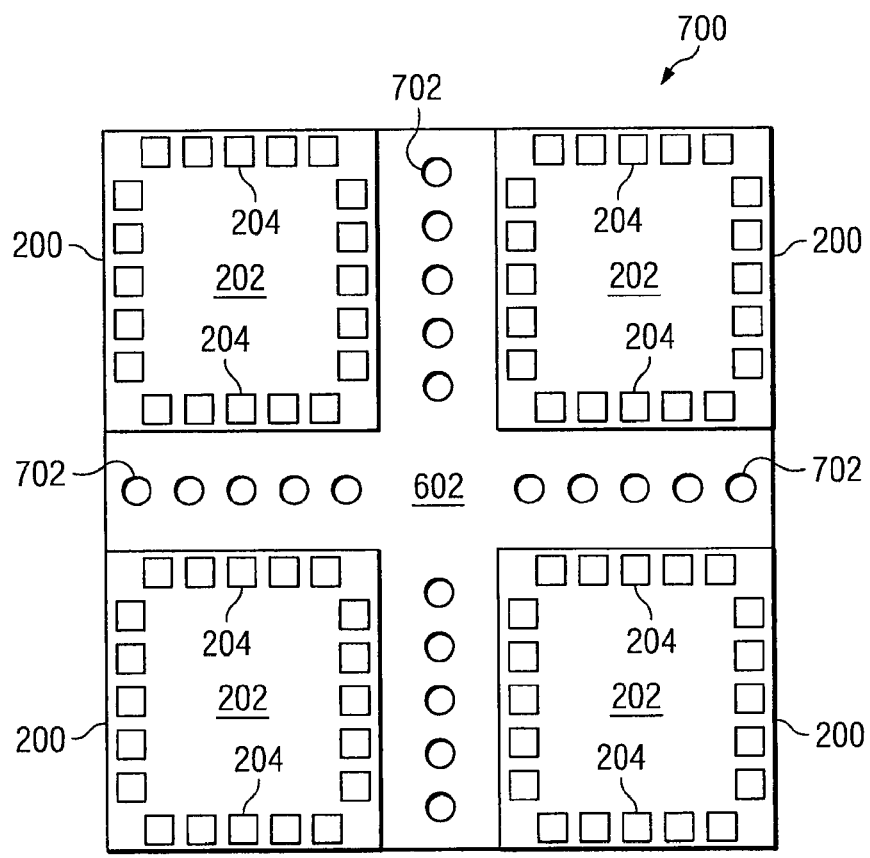

FIGS. 7A and 7B illustrate a fifth step in the first exemplary method of manufacturing the THV stackable semiconductor device as shown in FIGS. 2A and 2B in a side and top view, respectively. Segments 700 undergo a process to form a plurality of via holes 702 in organic material 602 as shown. The via holes can be formed in various processes, including a laser via drilling process or an etching process. As is shown, each of the via holes is configured in organic material 602 to correspond to respective bump pad 204 to which the via hole will be associated.

Figure 8A:
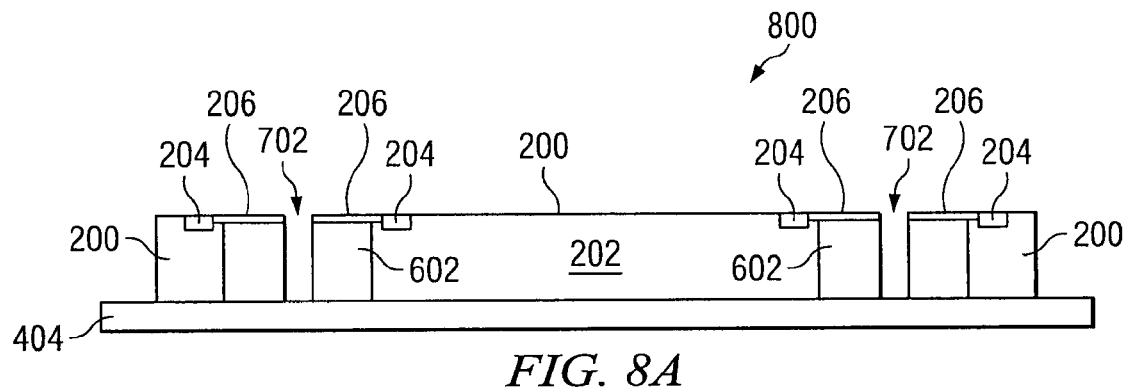
FIGS. 8A and 8B illustrate a sixth step in a first exemplary method of manufacturing the THV stackable semiconductor device as shown in FIGS. 2A and 2B in a side and top view, respectively.
Figure 8B:
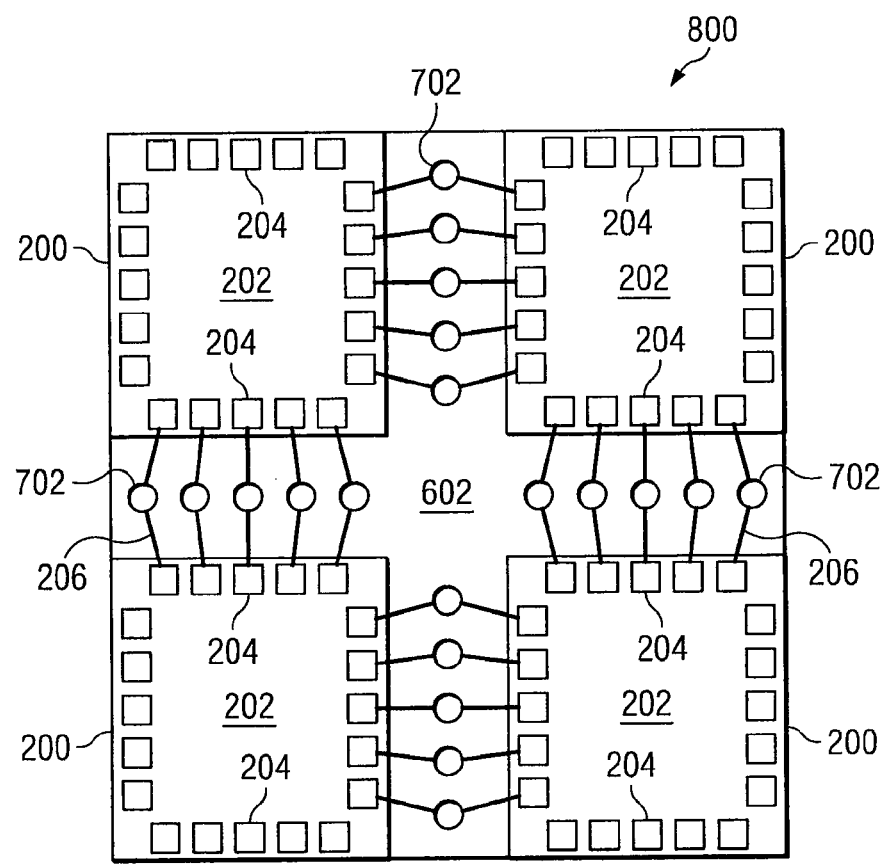

Turning to FIGS. 8A and 8B, a sixth step in the first exemplary method of manufacturing the THV stackable semiconductor device as shown in FIGS. 2A and 2B in a side and top view, respectively, is shown. FIGS. 8A and 8B illustrate a metal patterning process, which connects a series of metal traces 206 from bond pads 204 to via holes 702. Metal traces 206 electrically connect the bond pads to each of via holes 702 locations as shown.

Figure 9A:
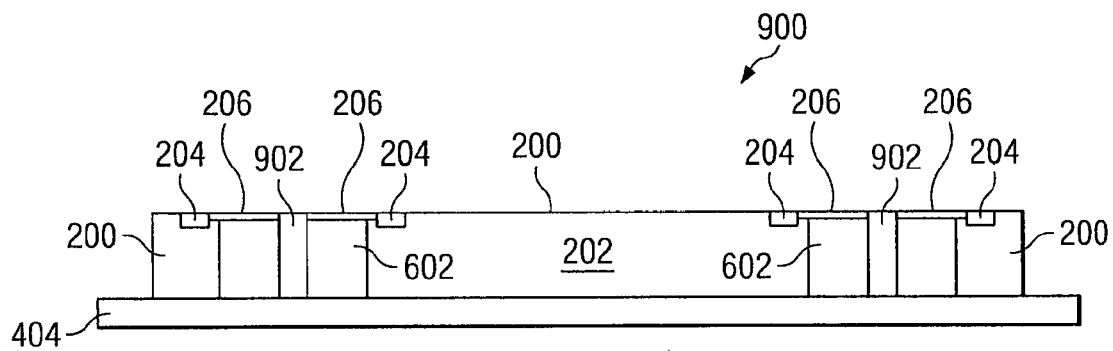
FIGS. 9A and 9B illustrate a seventh step in a first exemplary method of manufacturing the THV stackable semiconductor device as shown in FIGS. 2A and 2B in a side and top view, respectively.
Figure 9B:
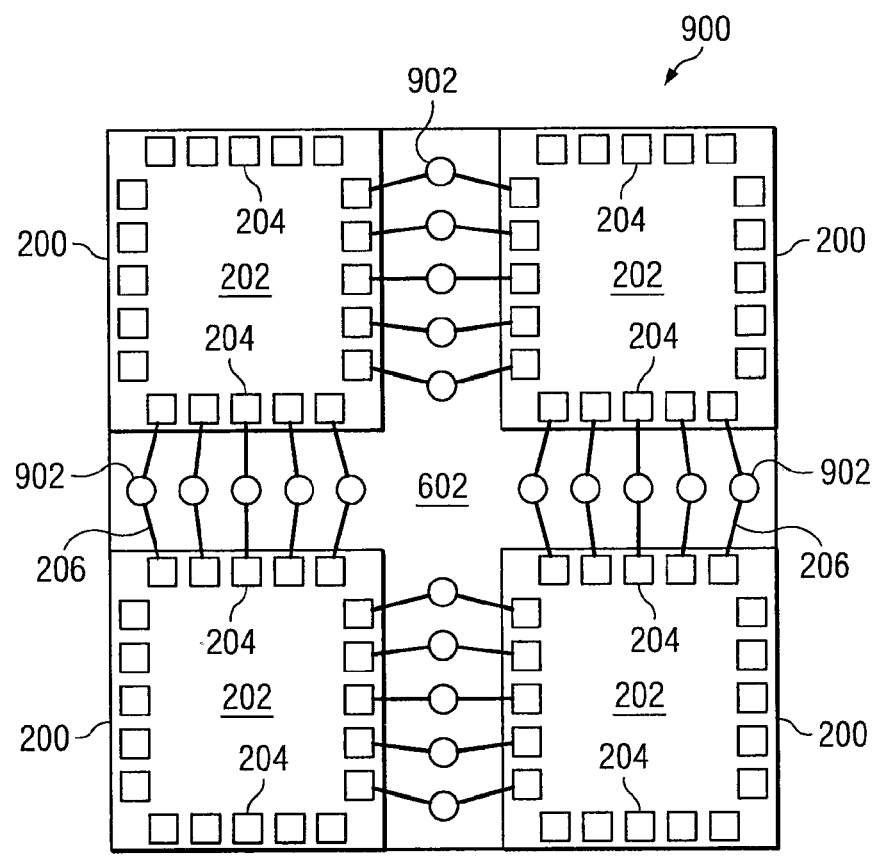

FIGS. 9A and 9B illustrate a seventh step in the first exemplary method of manufacturing the THV stackable semiconductor device as shown in FIGS. 2A and 2B. A via hole metal deposition process is performed to assembly 900 to deposit conductive material into each of via holes 702, forming a series of metal vias 902. The conductive material can be materials such as Al, copper (Cu), tungsten (W), combination of metal alloys, or any other conductive metal. Again, metal vias 902 are formed in organic material 602. A variety of methods and techniques can be used to form the metal vias, such as a plating or plugging process.

Figure 10A:
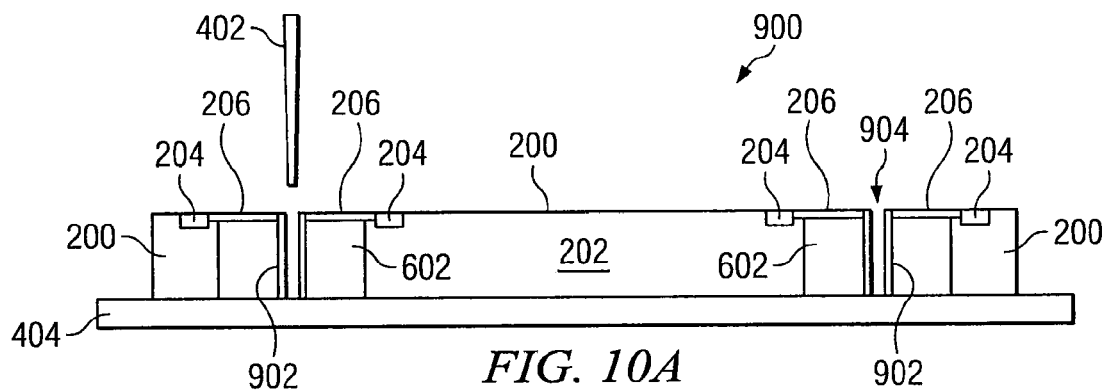
FIGS. 10A and 10B illustrate an eighth step in a first exemplary method of manufacturing the THV stackable semiconductor device as shown in FIGS. 2A and 2B in a side and top view, respectively.
Figure 10B:
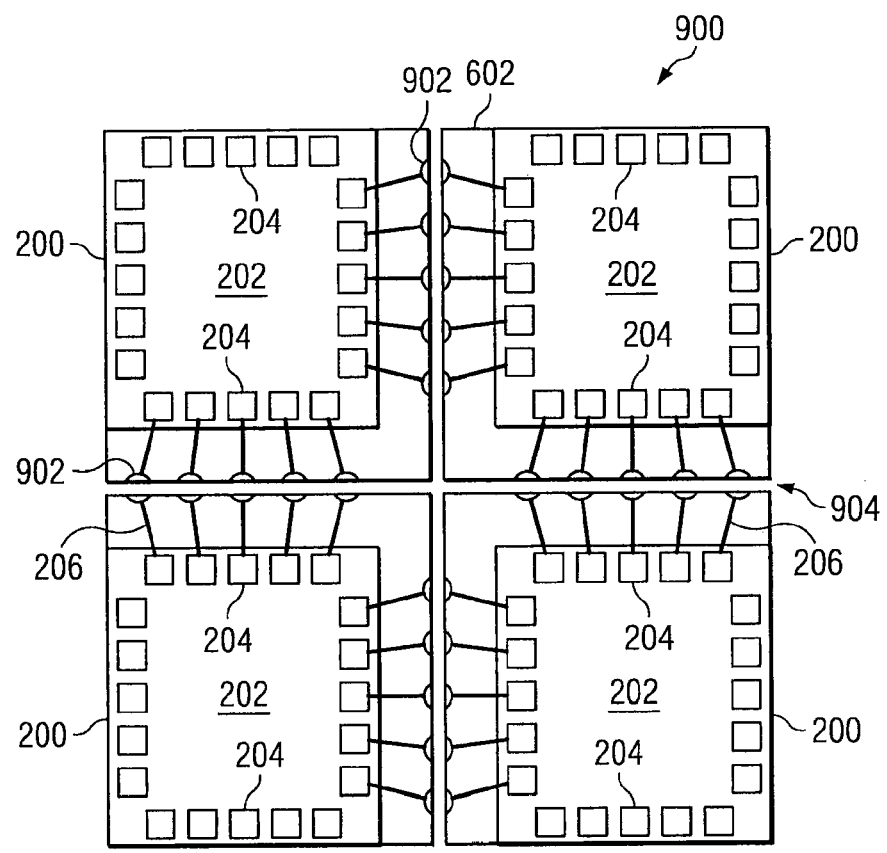

FIGS. 10A and 10B illustrate an eighth step in the first exemplary method of manufacturing the THV stackable semiconductor device as shown in FIGS. 2A and 2B. Wafer assembly 300, and 900 is singulated for a second time by a cutting tool 402 to form gaps 904. The various dies 202 shown in FIGS. 10A, 10B, and the preceding exemplary figures represent a smaller portion of a totality of semiconductor devices which are yielded from a particular wafer 300. As such, following the conclusion of the second singulation step, a majority of dies 202 are rendered to be like the embodiment shown in FIGS. 2A and 2B, where organic material 210 completely surrounds the peripheral surface of die 202, and THVs 902 are configured in rows along each side surface of the die as previously represented.

In one embodiment, following the singulation step depicted in FIGS. 10A and 10B, individual dies 202 are removed by a die pick and place process to remove each die 202 from dicing tape 404.

Figure 11A:
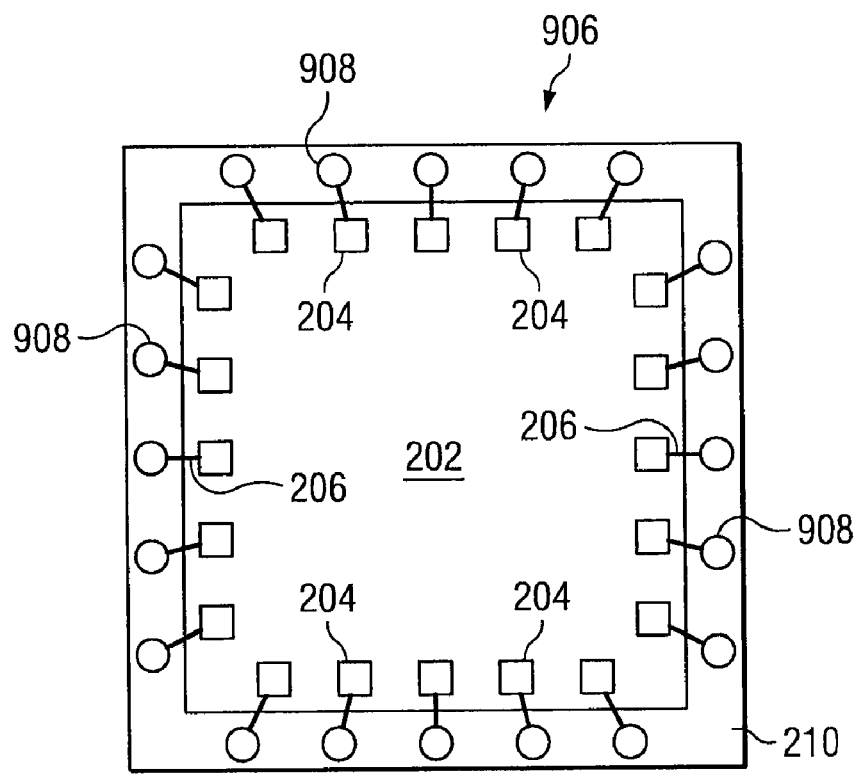
FIGS. 11A and 11B illustrate a second embodiment of a THV stackable semiconductor device incorporating a plurality of complete THVs, as shown in a top and side view, respectively.
Figure 11B:
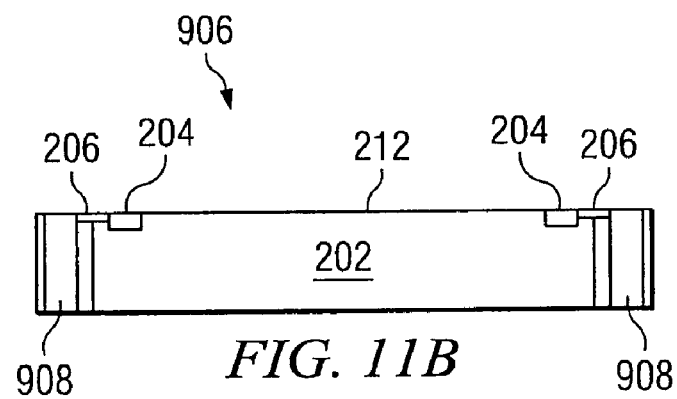

FIGS. 11A and 11B illustrate a second embodiment of a THV stackable semiconductor device 906 incorporating a plurality of complete THVs, as shown in a top and side view, respectively. The various features shown in the previous figures are shown, including die 202, bond pads 204, and metal tracings, which are formed on the active surface 212 of die 202. In the instant embodiment 906, the respective THVs 908 are complete, in lieu of being half-cut as shown in the previous embodiment. The depicted complete THVs 908 can be formed by a particular configuration of saw street guide 302 as shown in FIGS. 3A and 3B. A wider saw street guide 302 allows organic material 602 to be cut as shown, retaining a complete via hole 908.

Figure 12A:
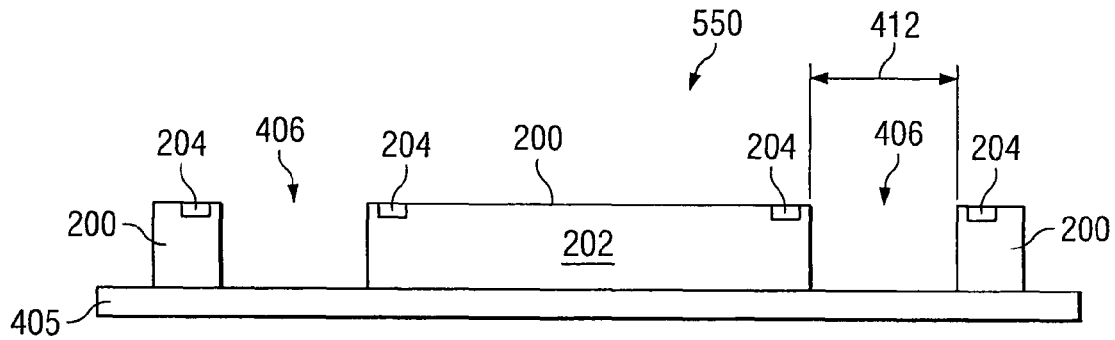
FIGS. 12A and 12B illustrate a third step in a second exemplary method of manufacturing the THV stackable semiconductor device as shown in FIGS. 2A and 2B in a side and top view, respectively.
Figure 12B:
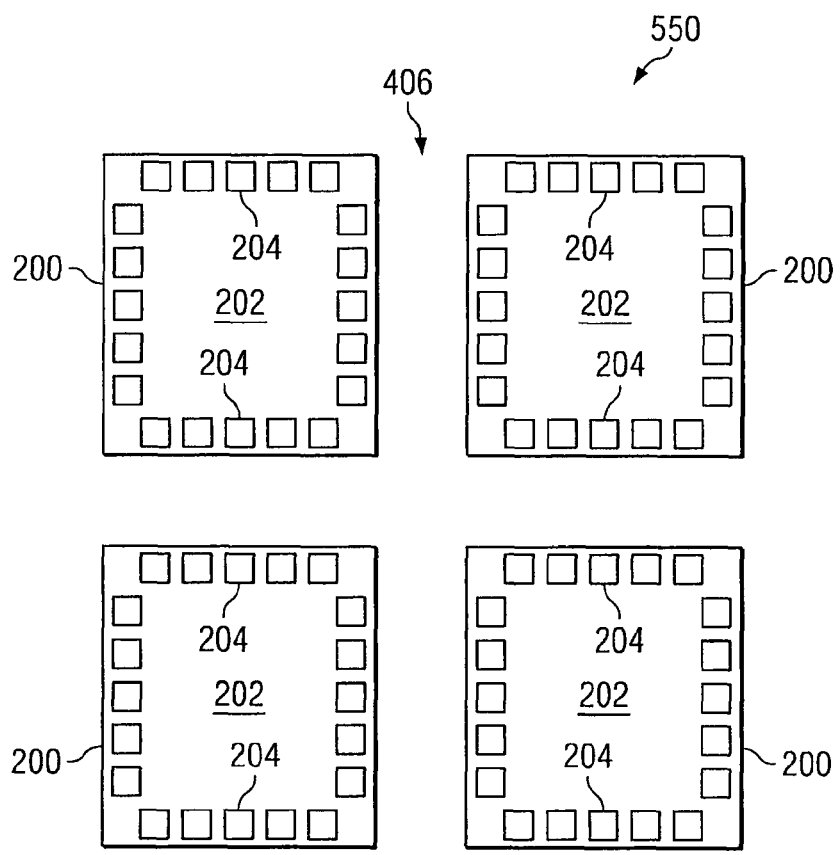

FIGS. 12A and 12B illustrate a third step in a second exemplary method of manufacturing the THV stackable semiconductor device as shown in FIGS. 2A and 2B in a side and top view, respectively. The second method of manufacture as described shares the first two steps, i.e., providing a wafer and singulation into respective segments upon dicing tape 404, as the first exemplary method previously described. In addition, various features such as bond pads 204 are again shown.

As a next step, wafer segments 550 are picked from dicing tape 404 and placed onto a wafer support system 405 as shown. The wafer support system can logically include a second dicing tape 405. However, the wafer support system can also be a temporary wafer support system, such as glass, ceramic, laminate, or silicon (Si) substrate. In one embodiment, sawn dies 202 are picked from dicing tape 404 and placed onto wafer support system 405 using pick and place machines. The pick and place process renders a gap 406 having a predetermined width or distance 412 between respective segments 550.

Figure 13A:
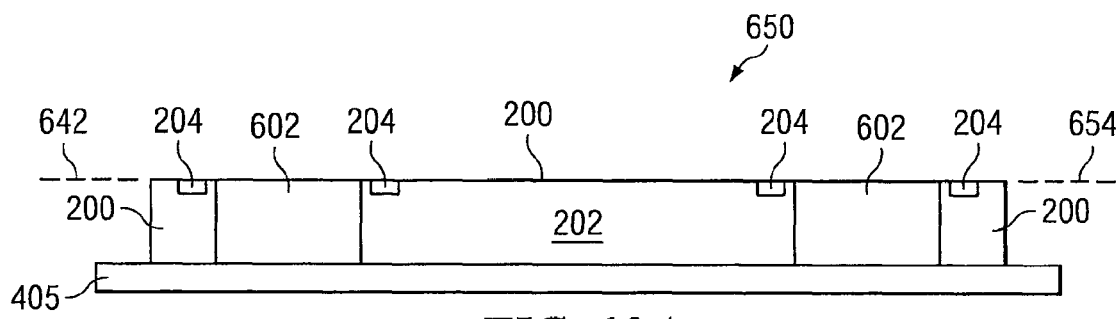
FIGS. 13A and 13B illustrate a fourth step in a second exemplary method of manufacturing the THV stackable semiconductor device as shown in FIGS. 2A and 2B in a side and top view, respectively.
Figure 13B:
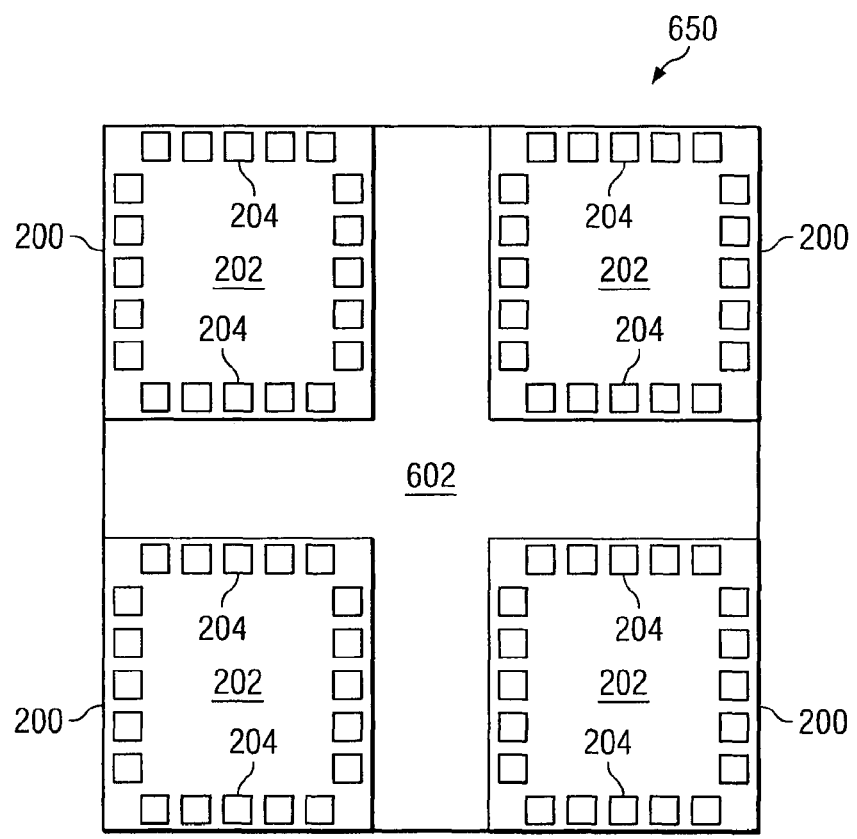

FIGS. 13A and 13B illustrate a fourth step in the second exemplary method of manufacturing the THV stackable semiconductor device as shown in FIGS. 2A and 2B. The organic material 602 is again applied to segments 650 in a similar spin-coating, needle dispensing, or other manner as previously described. Plane 642 of segments 650 is substantially coplanar with plane 654 of organic material 602.

Figure 14A:
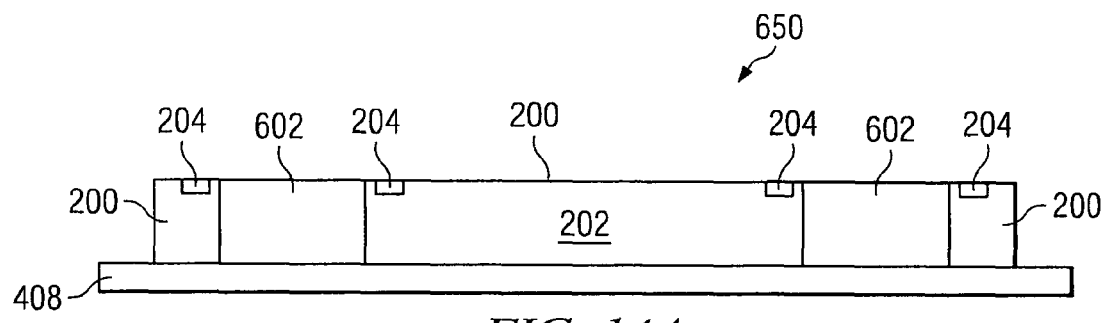
FIGS. 14A and 14B illustrate a fifth step in a second exemplary method of manufacturing the THV stackable semiconductor device as shown in FIGS. 2A and 2B in a side and top view, respectively.
Figure 14B:
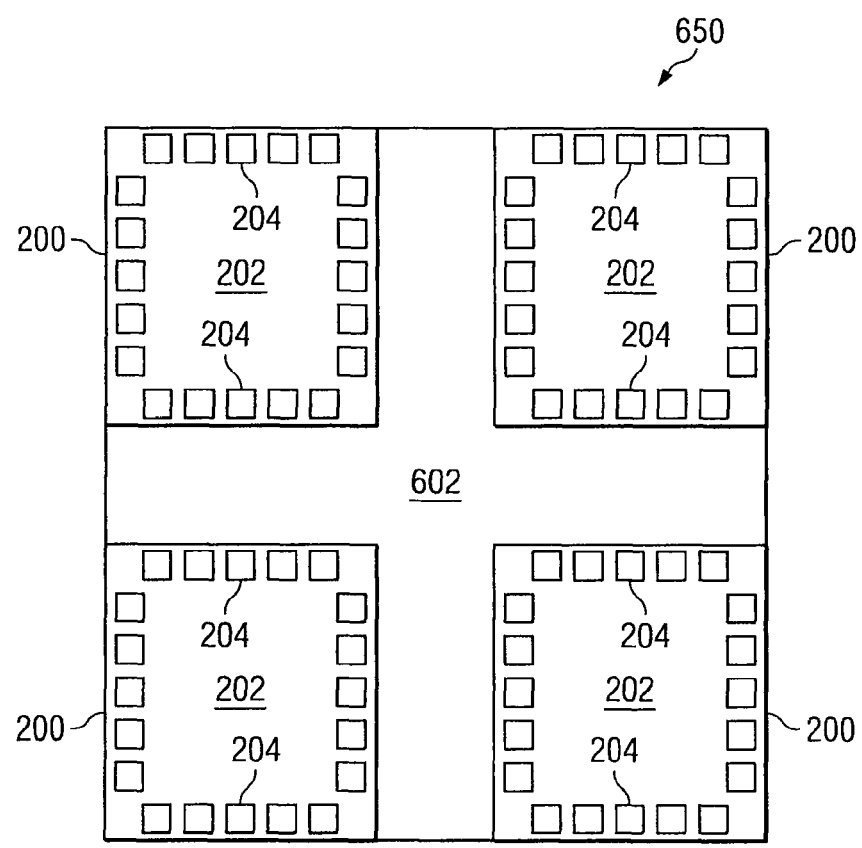

Turning to FIGS. 14A and 14B, a fifth step in the second exemplary method of manufacturing the THV stackable semiconductor device is shown in FIGS. 2A and 2B. The recoated wafer 300 is transferred onto a second wafer support system 408. The second wafer support system can again include glass, Si substrate materials, ceramic, and laminate materials.

Figure 15A:
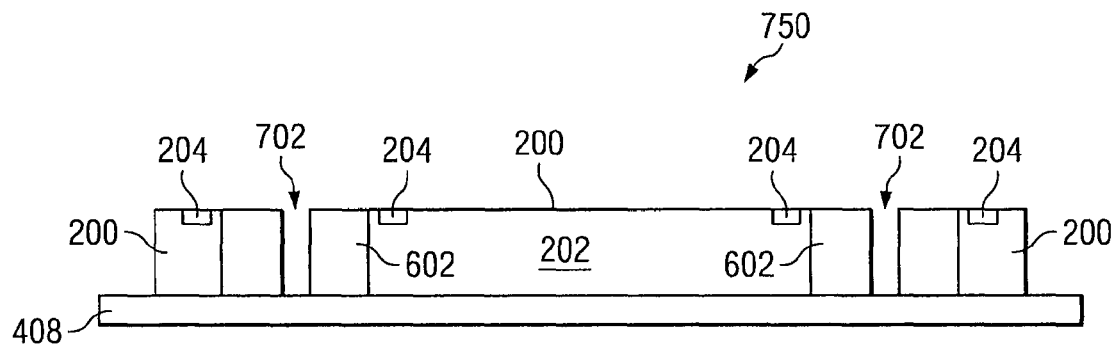
FIGS. 15A and 15B illustrate a sixth step in a second exemplary method of manufacturing the THV stackable semiconductor device as shown in FIGS. 2A and 2B in a side and top view, respectively.
Figure 15B:
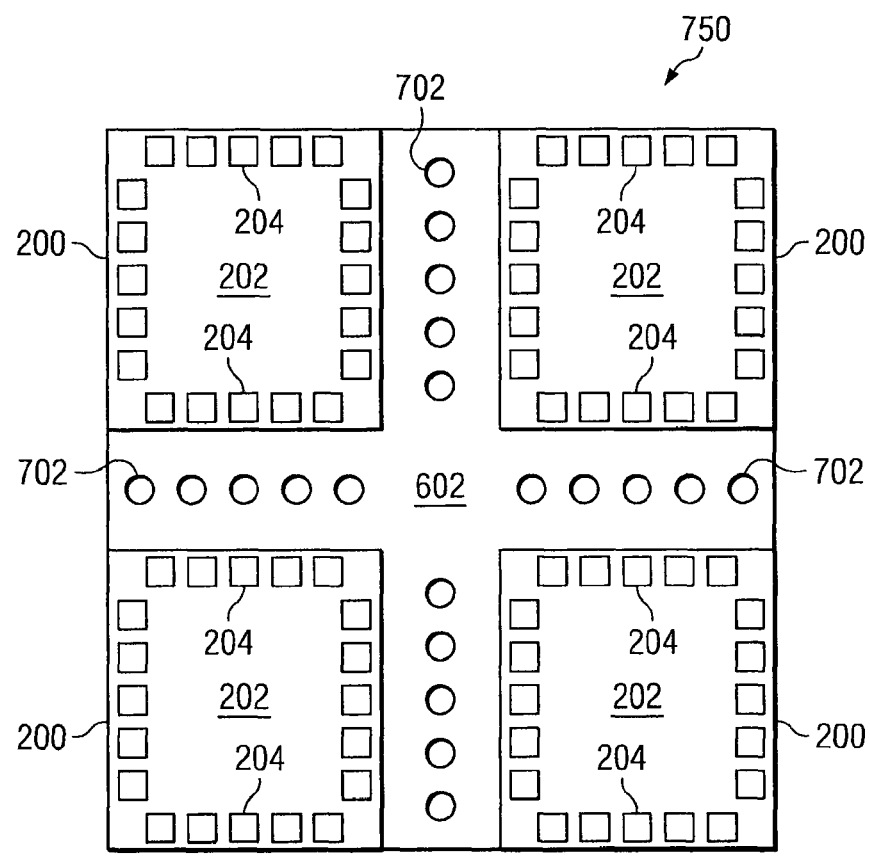

FIGS. 15A and 15B illustrate a sixth step in the second exemplary method of manufacturing the THV stackable semiconductor device as shown in FIGS. 2A and 2B in a side and top view, respectively. In a step 750, similar to that shown in FIGS. 7A and 7B, a plurality of via holes 702, is formed in organic material 602 to coincide with bond pads 204.

Figure 16A:
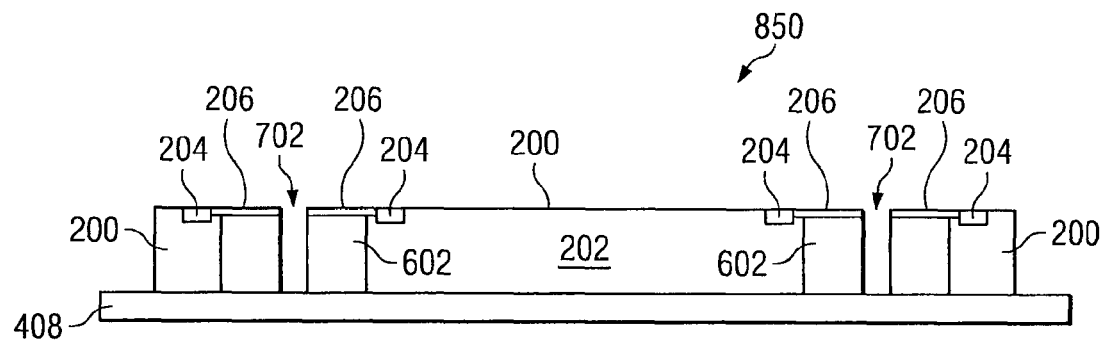
FIGS. 16A and 16B illustrate a seventh step in a second exemplary method of manufacturing the THV stackable semiconductor device as shown in FIGS. 2A and 2B in a side and top view, respectively.
Figure 16B:
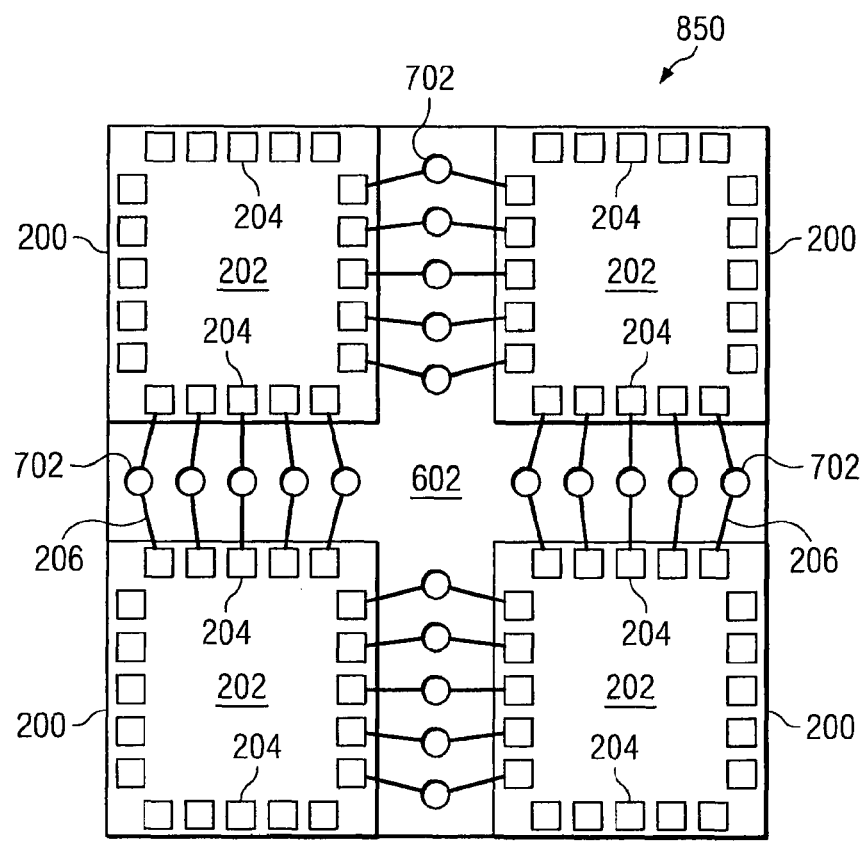

FIGS. 16A and 16B illustrate a seventh step 850 in the second exemplary method of manufacturing the THV stackable semiconductor device as shown in FIGS. 2A and 2B in a side and top view, respectively. Step 850 is again similar to that shown in FIGS. 8A and 8B of metal patterning of metal traces 206 to electrically couple bond pad 204 locations to via 702 locations.

Figure 17A:
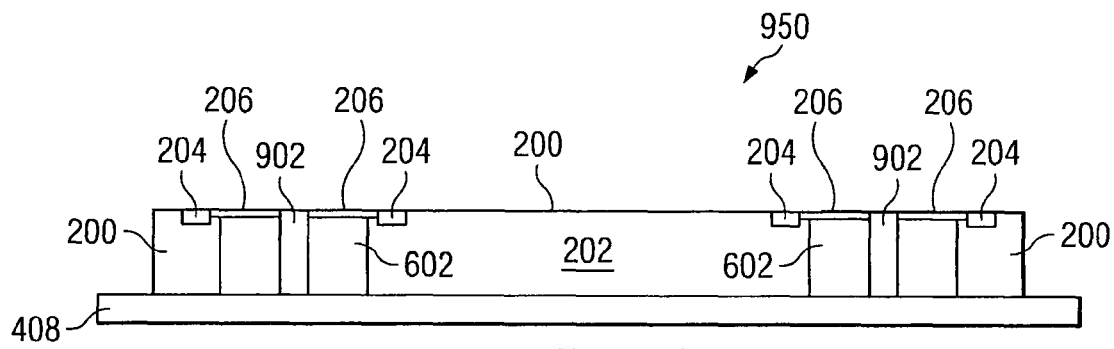
FIGS. 17A and 17B illustrate an eighth step in a second exemplary method of manufacturing the THV stackable semiconductor device as shown in FIGS. 2A and 2B in a side and top view, respectively.
Figure 17B:
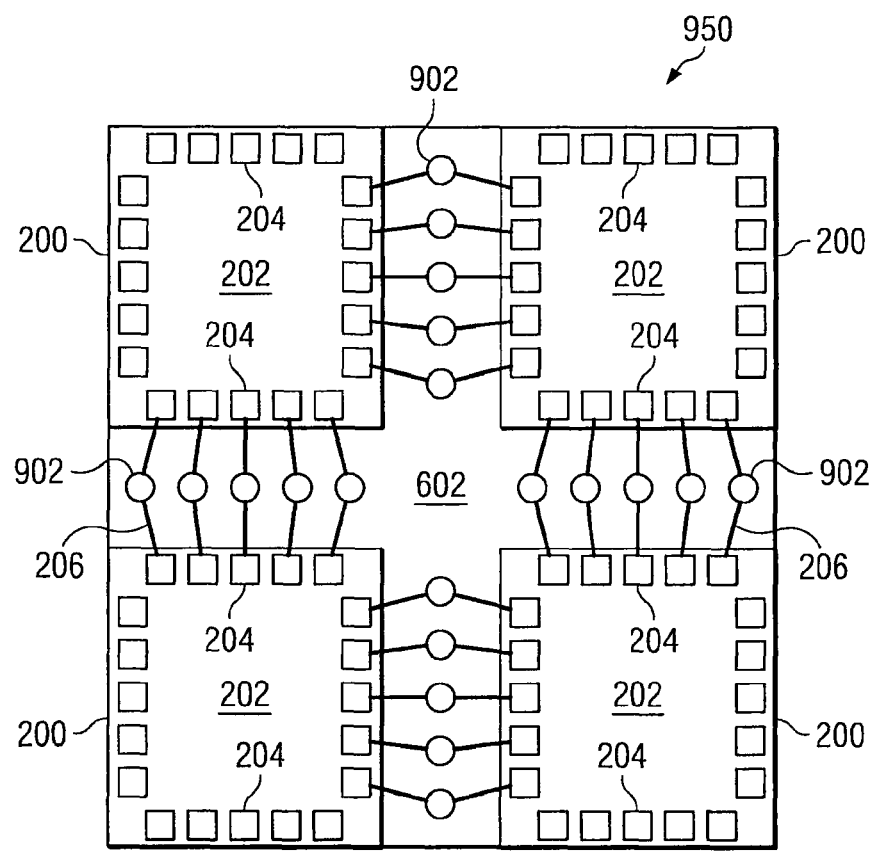

FIGS. 17A and 17B illustrate an eighth step 950 in the second exemplary method of manufacturing the THV stackable semiconductor device as shown in FIGS. 2A and 2B. Vias 702 are plugged, plated or otherwise deposited with a conductive material to fill via holes 702 and render metal vias 902 as shown.

Figure 18A:
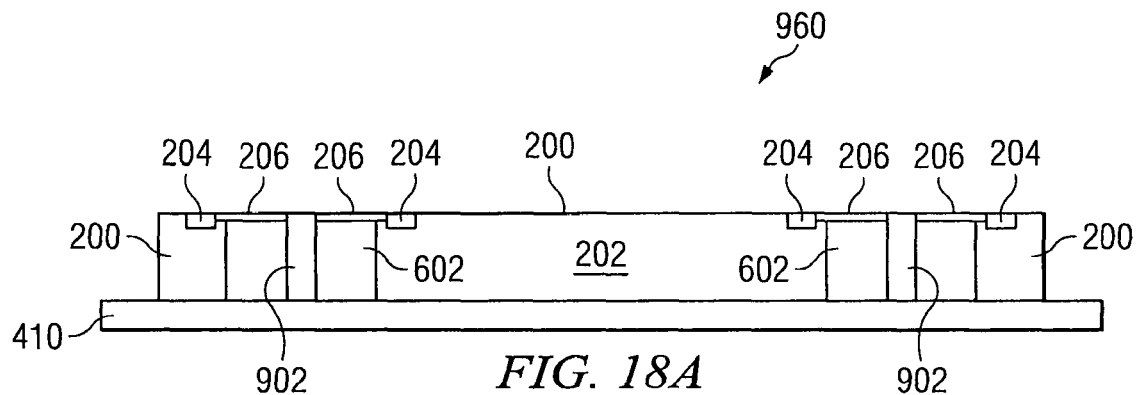
FIGS. 18A and 18B illustrate a ninth step in a second exemplary method of manufacturing the THV stackable semiconductor device as shown in FIGS. 2A and 2B in a side and top view, respectively.
Figure 18B:
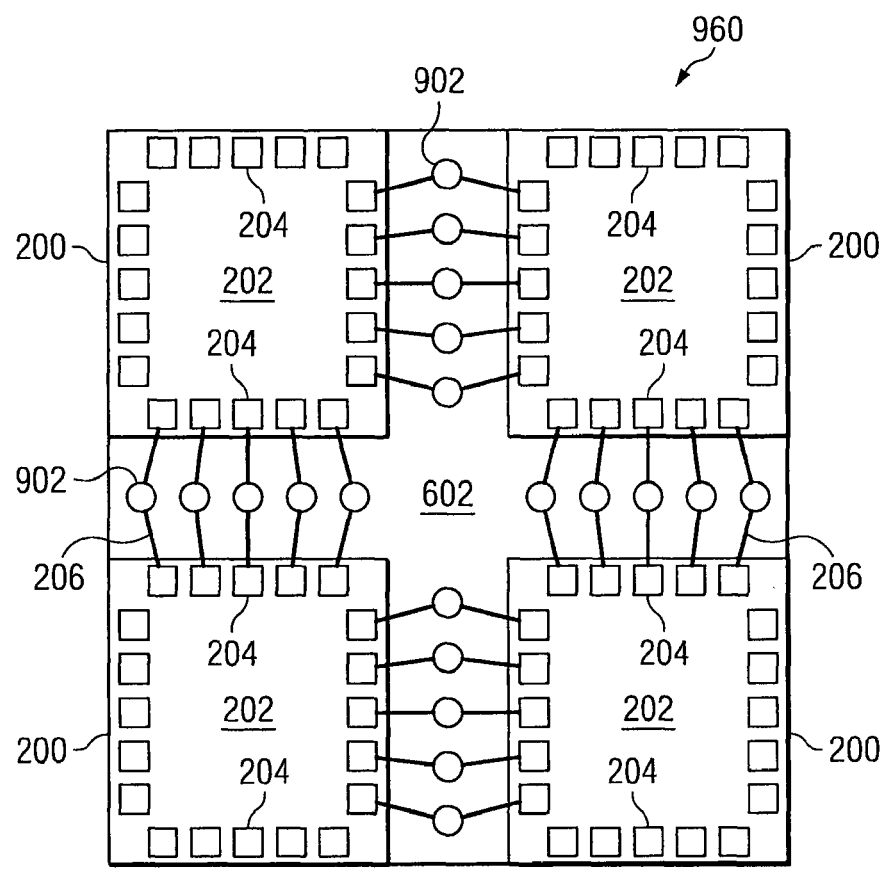

Following the metal via 902 formation process, via hole wafer 960 is transferred onto an additional dicing tape 410 as shown in FIGS. 18A and 18B, which illustrates the depicted ninth step.

Figure 19A:
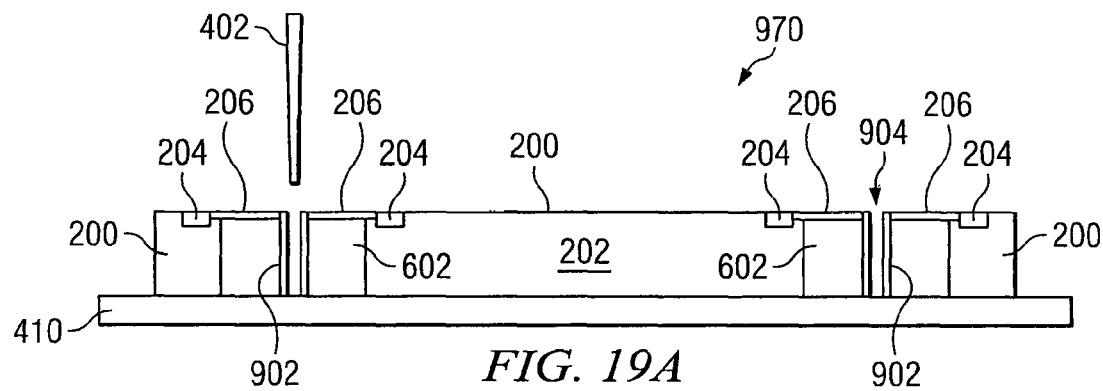
FIGS. 19A and 19B illustrate a tenth step in a second exemplary method of manufacturing the THV stackable semiconductor device as shown in FIGS. 2A and 2B in a side and top view, respectively.
Figure 19B:
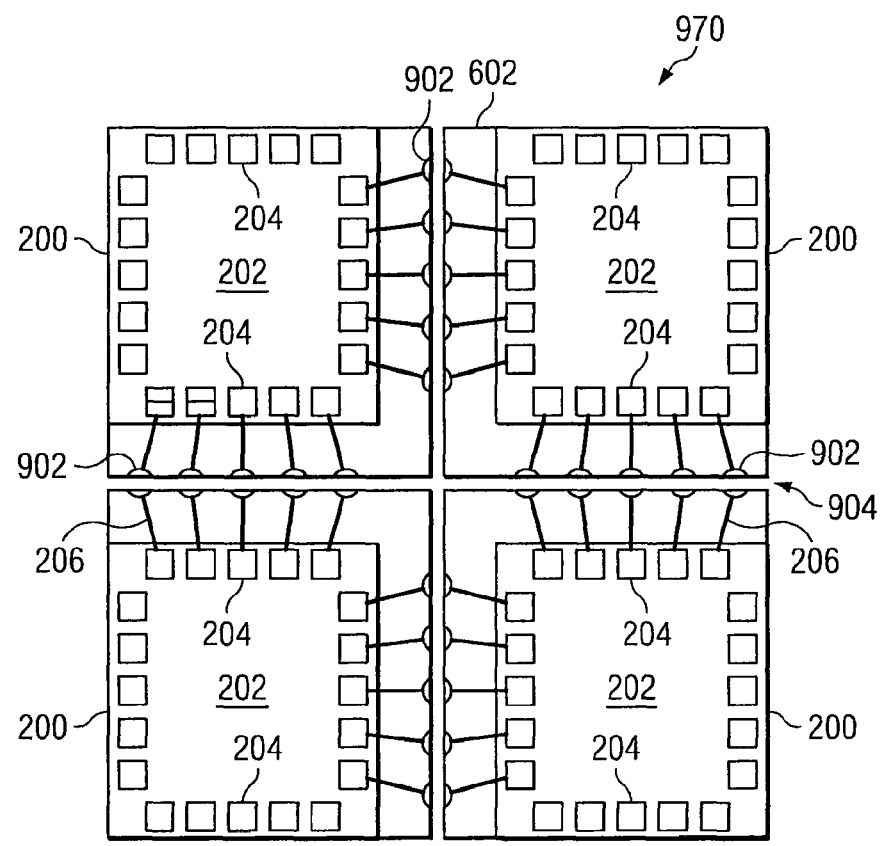

FIGS. 19A and 19B illustrate a tenth step in the second exemplary method of manufacturing the THV stackable semiconductor device as shown in FIGS. 2A and 2B. A cutting tool 402 is again used to singulate via hole wafer 960 into the depicted segments 970, resulting in gaps 904. As a final step, following the second singulation process, a die pick and place machine can be utilized to again remove each device 200 from dicing tape 410.

Figure 20:
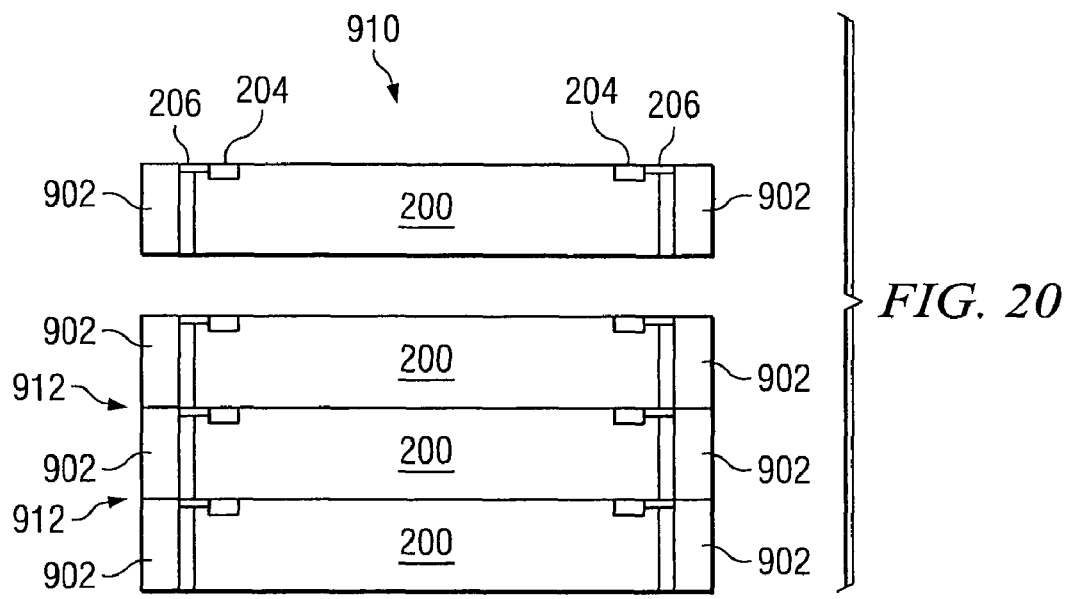
FIG. 20 illustrates a third exemplary embodiment of a THV stackable semiconductor device, shown utilizing a die-to-die stacking configuration in a side view.

FIG. 20 illustrates a third exemplary embodiment of THV stackable semiconductor devices 910, shown utilizing a die-to-die stacking configuration in a side view. A series of devices 200 can be stacked as shown to suit a particular application. Each of the metal vias 902 can be joined together as shown by union 912 using a direct via metal bonding process. Any number of devices 200 can be stacked as shown to realize a desired implementation.

Figure 21:
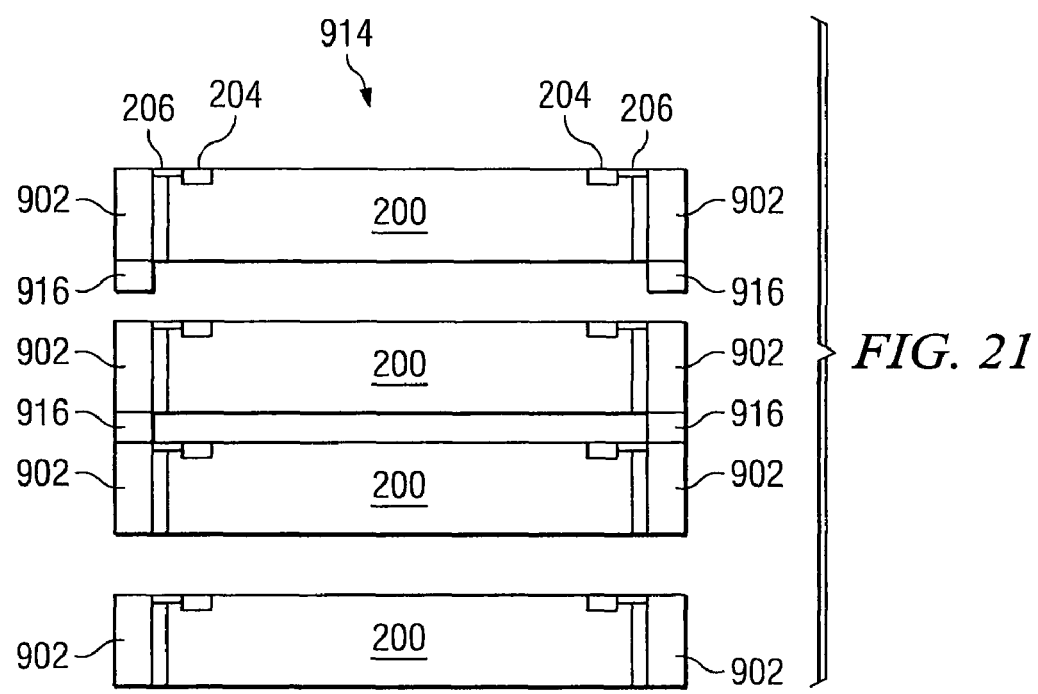
FIG. 21 illustrates a fourth exemplary embodiment of a THV stackable semiconductor device, shown utilizing a die-to-die stacking configuration, which incorporates solder paste, again in a side view.

FIG. 21 illustrates a fourth exemplary embodiment of THV stackable semiconductor devices, shown utilizing a die-to-die stacking configuration which incorporates solder paste 916, again in a side view. Solder paste 916 includes a mix of small solder particles and flux. A variety of solder pastes of various materials can be incorporated. Solder paste 916 can be applied using a reflow soldering method to create a strong metallurgical bond between each of stacked devices 914.

Figure 22:
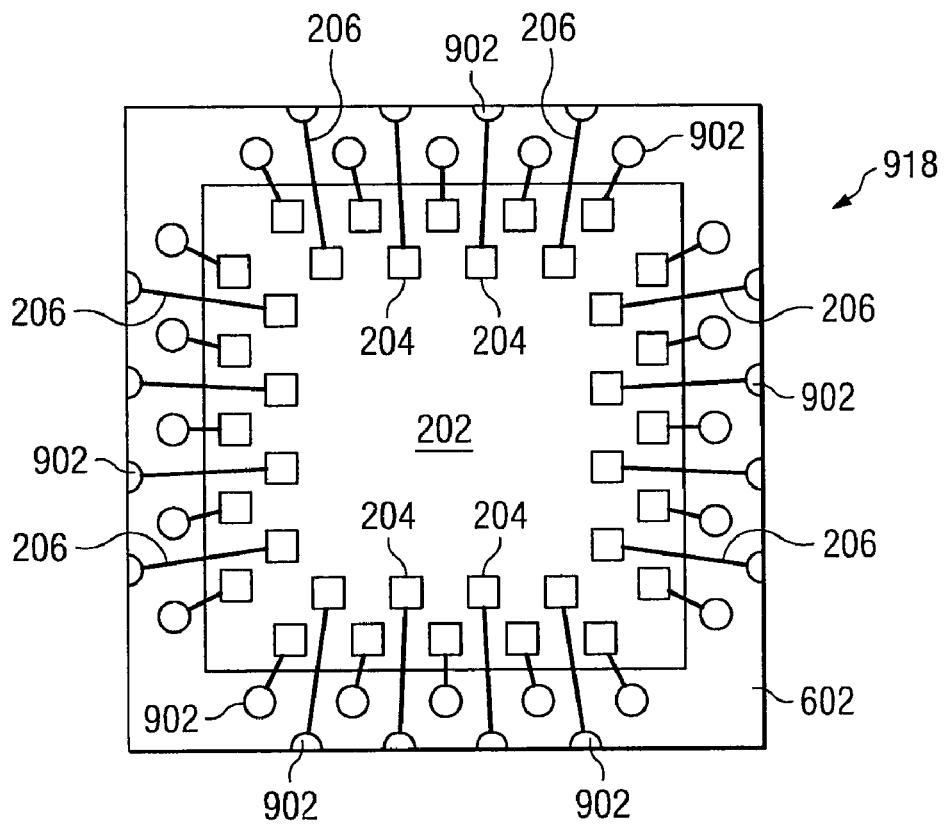
FIG. 22 illustrates a fifth exemplary embodiment of a THV stackable semiconductor device, having multiple rows of bond pads and multiple rows of via holes as shown in a top view.

A fifth exemplary embodiment of a THV stackable semiconductor device 918 is shown in FIG. 22. The present embodiment includes multiple rows of bond pads 204 and multiple rows of via holes 902 as shown in a top view, which are appropriately connected with metal tracings 206. Each of the via holes 902 are disposed in organic material 602 as shown. Any number of configurations of dies 202 having multiple rows of bond pads 204 and multiple rows of via holes 902 can be implemented. In addition to the present embodiment 918, another embodiment can be realized which connects the depicted half-cut outer vias 902 to bond pads 204, which are not located on the active surface of die 202, but on an additional surface, such as an additional die 202 or elsewhere as a specific implementation requires.

Figure 23:
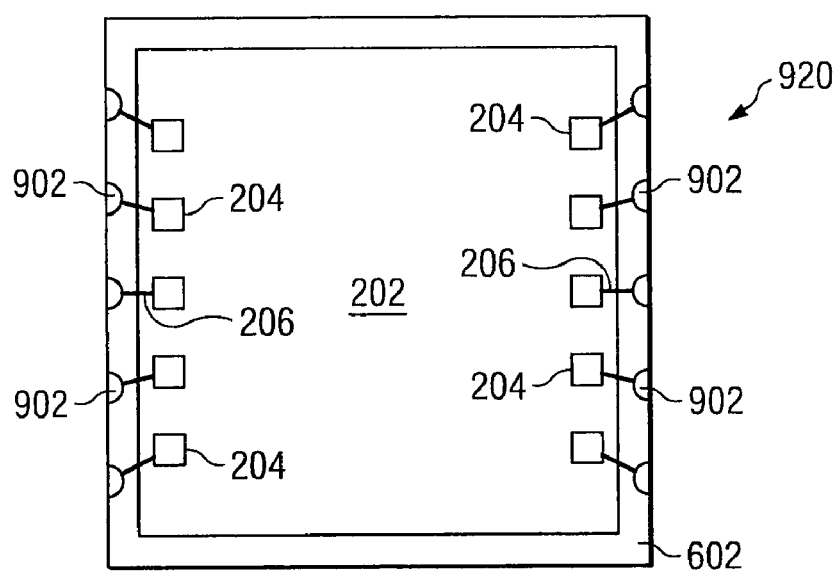
FIG. 23 illustrates a sixth exemplary embodiment of a THV stackable semiconductor device, incorporating a row of half-cut via holes coupled to a row of bond pads on opposing sides of a die as shown in a top view.

A sixth exemplary embodiment of a THV stackable semiconductor device 920 is shown in FIG. 23. Device 920 illustrates an additional configuration of bond pads 204, traces 206, and a series of half-cut vias 902, which are disposed on opposing sides of die 202. The dies 902 are formed in organic material 602, which is disposed on each peripheral side of die 202 as shown. In a variation of the depicted embodiment 920, a configuration can include complete vias 902.

Figure 24:
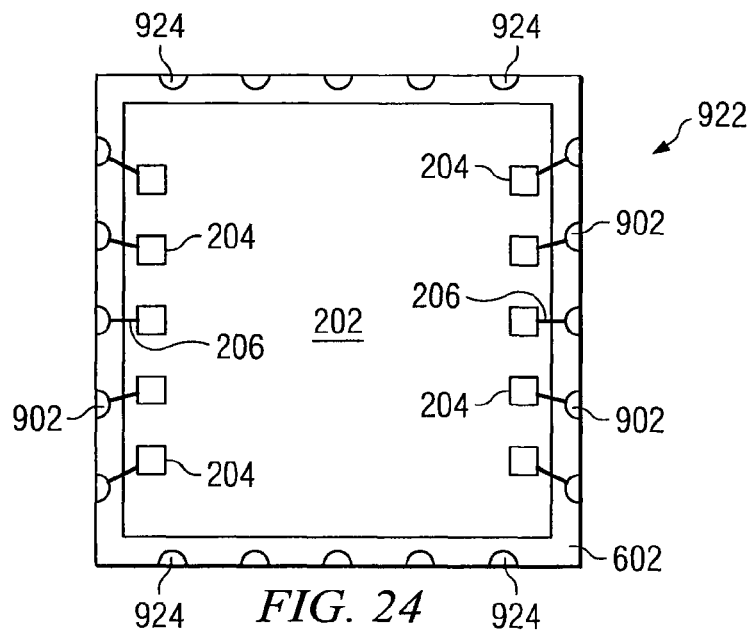
FIG. 24 illustrates a seventh exemplary embodiment of a THV stackable semiconductor device, incorporating dummy via holes on opposing sides as shown in a top view.

A seventh exemplary embodiment of a THV stackable semiconductor device 922 is depicted in FIG. 24. Device 922 includes a series of dummy via holes 924, which are disposed on opposing sides of die 202 as shown. Vias 902 are disposed on the left and right hand side as shown. Dummy via holes 924 can provide for electrical connectivity through device 922 for specific applications. Dummy via holes 924 can be used to connect an additional device 922 or package using a wire-bonding process. In addition, holes 924 can act as a ground or as a conduit for input/output (I/O) signals.

Figure 25:
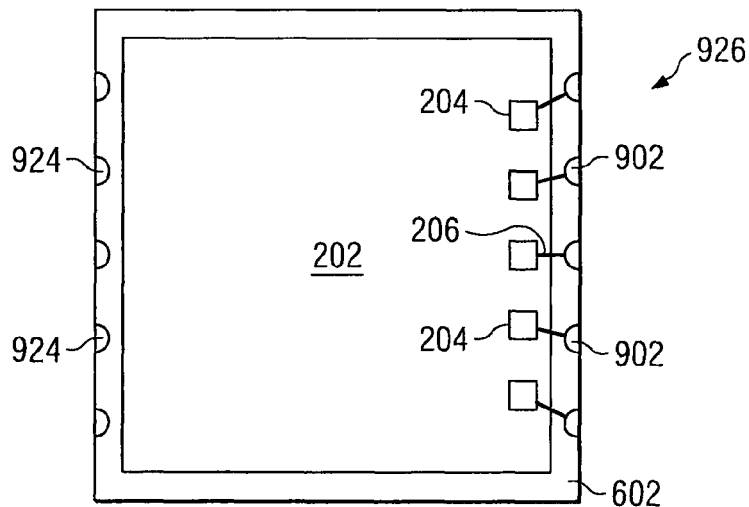
FIG. 25 illustrates an eighth exemplary embodiment of a THV stackable semiconductor device, incorporating dummy via holes on a single side as shown in a top view.

Dummy holes 924 can be configured, as with vias 902, in a variety of implementations. For example, multiple rows, or full or half-cut holes 924 can be implemented. FIG. 25 illustrates one such embodiment of a device 926, which includes a row of half-cut dummy vias 924 on the left side of die 202, and a row of THVs 902, on the right side of die 202, again disposed in organic material 602.

Figure 26:
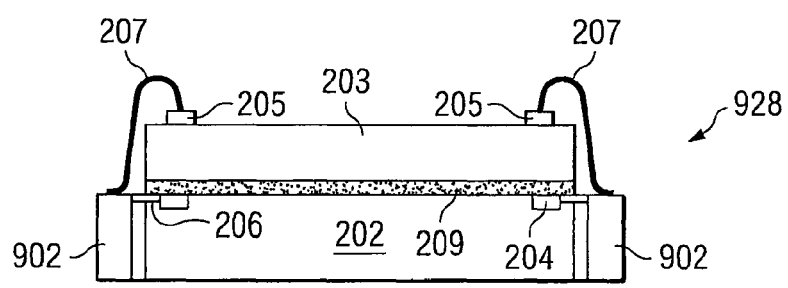
FIG. 26 illustrates a ninth exemplary embodiment of a THV stackable semiconductor device, depicting two stacked dies utilizing the dummy via holes as shown in FIGS. 24 and 25 to connect a top die with a wire-bonding process.

FIG. 26 illustrates a ninth exemplary embodiment of a THV stackable semiconductor device 928, depicting two stacked dies 202 and 203 utilizing dummy via holes 902 as shown in FIGS. 24 and 25 to connect a top die 203 with a wire-bonding process. A series of bond pads 205 is disposed on an active surface of die 203. Wire bonds 207 connect bond pads 204 to vias 902. A dielectric, insulating or bonding material 209 is disposed between die 202 and die 203 to provide structural support for device/package 928.

Semiconductor devices, such as device 200 incorporating a series of THVs 208 or 902 can provide a variety of functionality and flexibility in various applications. Use of organic material 210 allows placement of vias 208 outside die 202, which allows for additional circuitry within die 202 and enhancing the functionality of device 200. In addition, by using organic material 210 instead of wafer 300 material, the respective yield per wafer is increased. The organic material can be configured to be as thick as needed to accommodate a variety of vias 208 in any number of applications.

Device 200 can be integrated into a variety of same size die configurations. A same-size configuration allows for a reduction in package size, as a wider package area is generally needed to accommodate other offset configurations. Same-size configurations eliminate the problems associated with asymmetrical stacking of dies, which can cause severe package warping in some cases. In addition, same-size configurations exhibit the benefits of having a limited number of associated bond wires, and consequently, limiting the wire-bonding process time needed in a manufacturing step to accomplish the wire-bonding task.

Figure 27A:
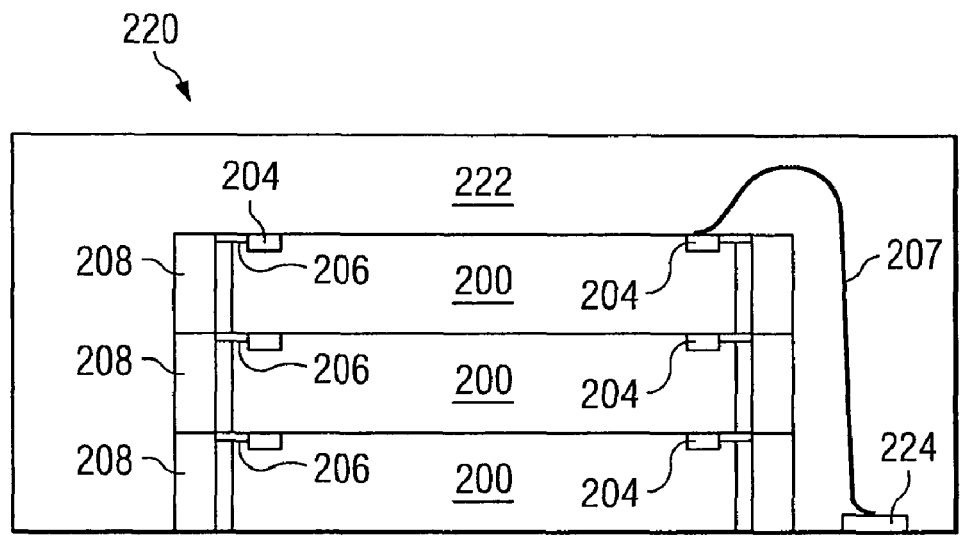
FIG. 27A illustrates a first exemplary same-size semiconductor package incorporating a series of stacked THV dies.

FIG. 27A illustrates a first exemplary embodiment of semiconductor device 220, which incorporates a series of same-size, stacked THV dies 200. As shown, a top surface of THV 208 of a first THV die 200 is coupled to a bottom surface of via 208 of a stacked, second THV die 200. A series of same-size, THV dies 200 can be stacked, one on top of another, in this fashion. In many of the embodiments which will be further described, THV dies 200 are stacked three deep. Again, vias 208 of each of the interconnected THV dies 200 can also be electrically interconnected as needed.

Returning to FIG. 27A, the top THV die 200 is wire-bonded using wire 207, which is connected between the top bond pad 204 and terminal land 224 located along the bottom surface of package 220. Terminal land 224 can have a portion therewith exposed to provide electrical connectivity to a separate electrical component. An encapsulant 222 is disposed above portions of THV dies 200 to provide structural support.

Figure 27B:
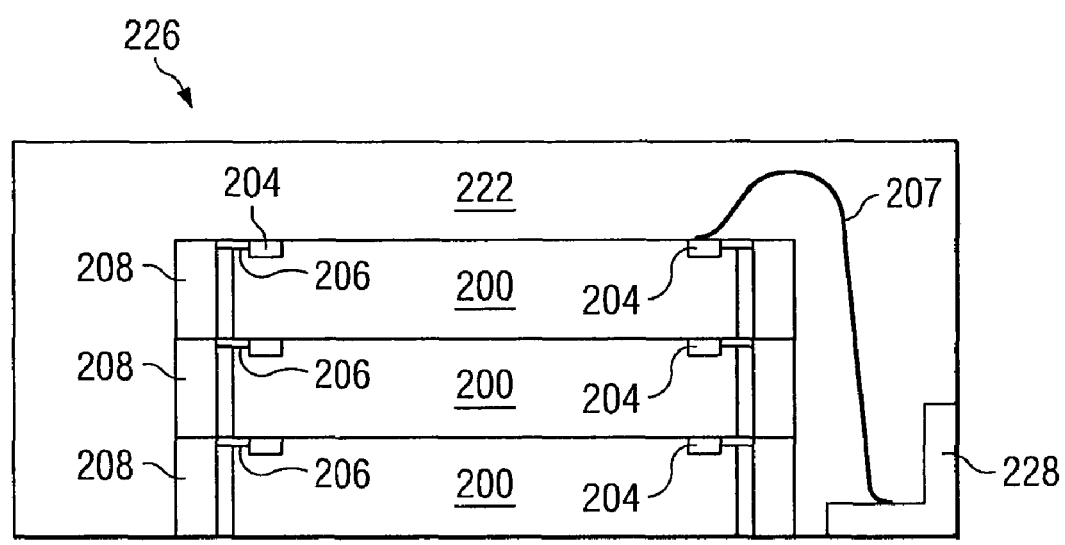
FIG. 27B illustrates a second exemplary same-size semiconductor package incorporating a series of stacked, same-size THV dies which are wire-bonded to a leadframe structure.

FIG. 27B illustrates an additional package 226, in many ways similar to package 220 illustrated in FIG. 27A. A portion of a leadframe structure 228 is incorporated into package 226, to which THV dies 200 are wire-bonded. The leadframe structure 228 is also supported by encapsulant 222.

Figure 28A:
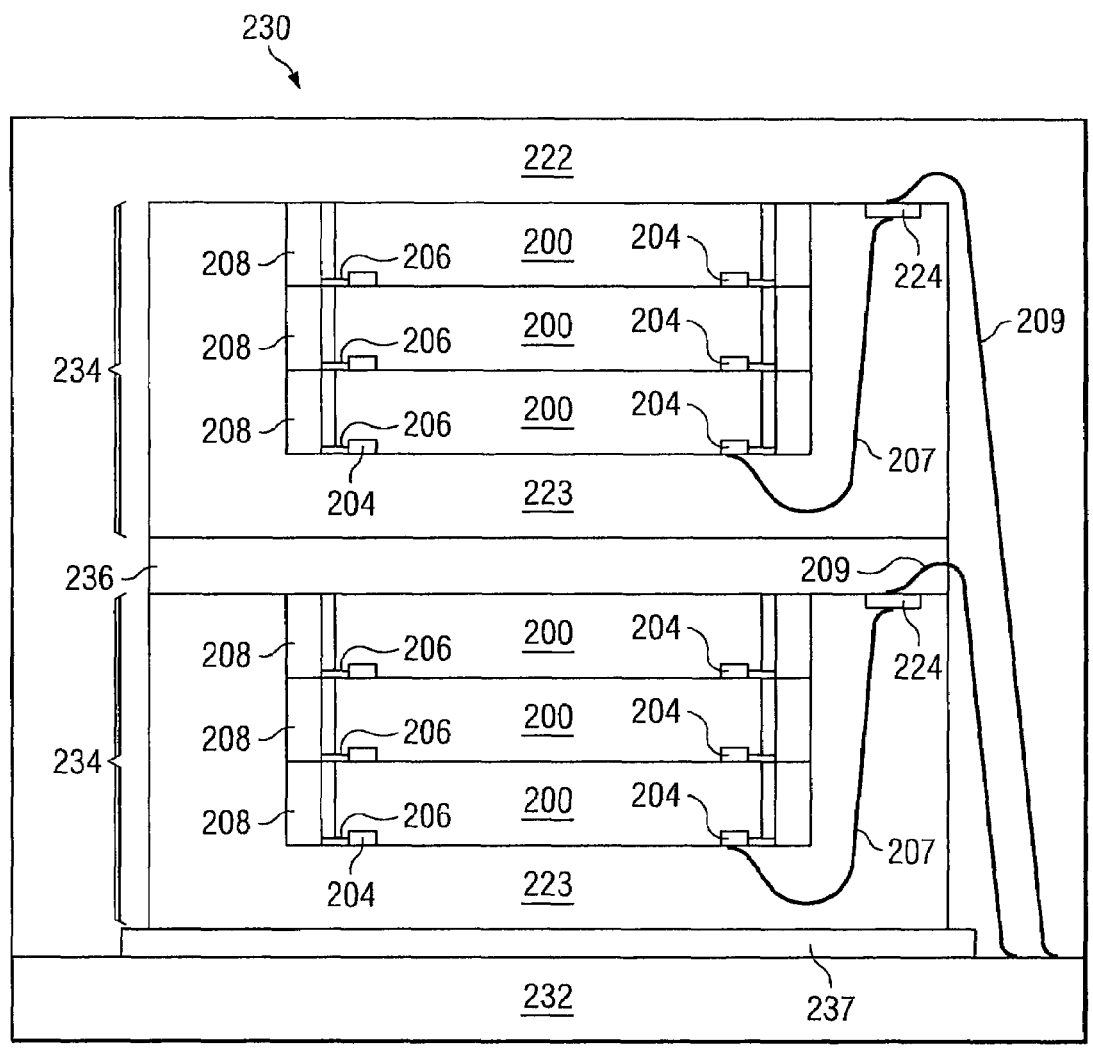
FIG. 28A illustrates a third exemplary same-size semiconductor package incorporating a series of stacked, same-size THV dies which are wire-bonded to a substrate.

FIG. 28A illustrates package 230, were a series of two integrated THV die packages 234 are coupled together using a die attach (D/A) adhesive 236 or similar material. Each of the packages 234 is wire-bonded using wires 207 to terminal land 224, and in turn, wire-bonded from terminal land 224 using wires 209 to circuit carrier substrate 232. The packages 234 include a set of three THV dies 220, which are connected in a similar manner to package 220 shown in FIG. 27A. An additional adhesive material or a similar material 237 bonds the set of packages 234 to substrate 232. An encapsulant 223 is disposed around each individual package 234. Additionally, encapsulant 222 is disposed around the set of packages 234.

Figure 28B:
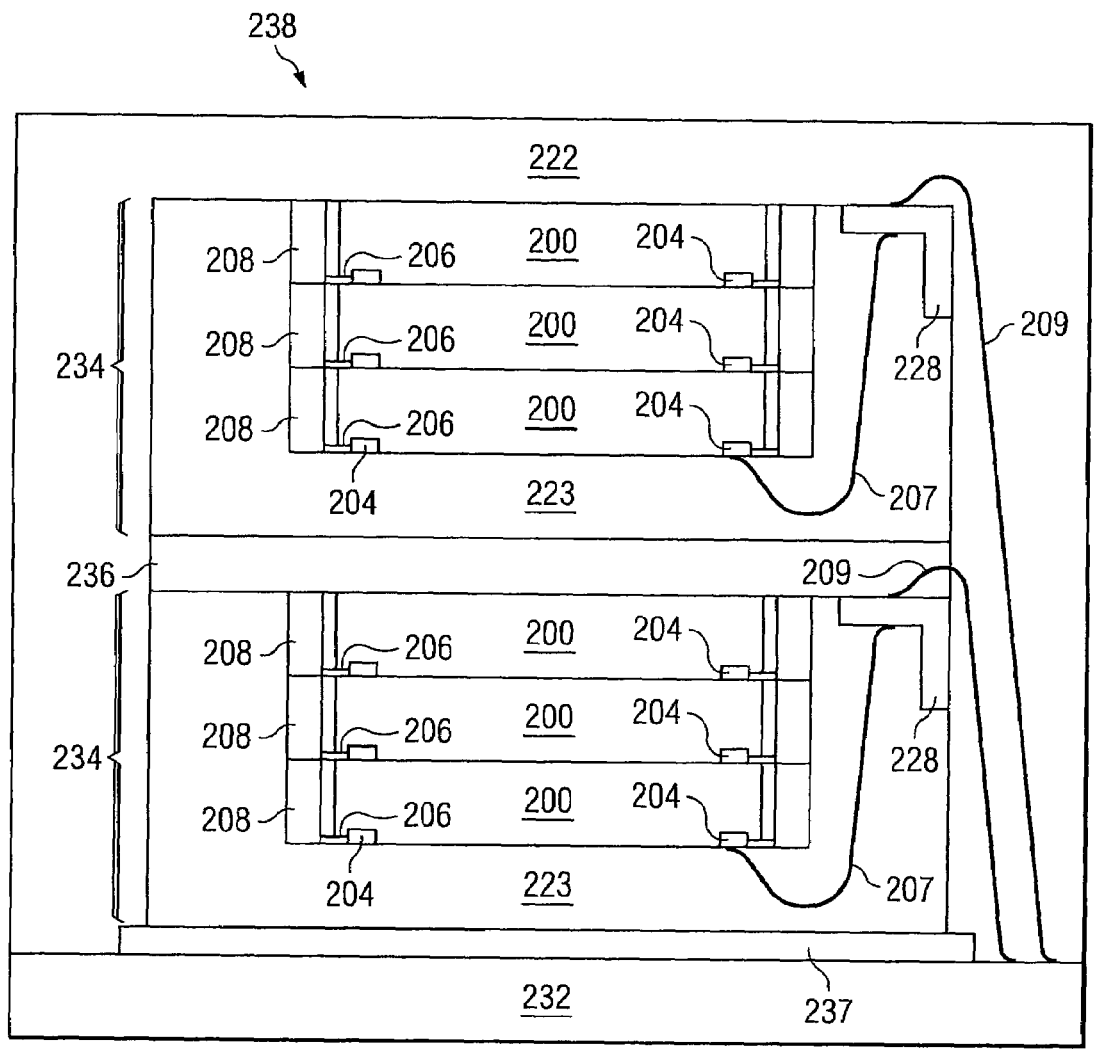
FIG. 28B illustrates the embodiment depicted in FIG. 29A with the addition of an incorporated leadframe structure.

In a similar embodiment, package 238 also includes a set of two integrated packages 234, which are similar to package 226 depicted in FIG. 28B, where a portion of a leadframe material 228 is integrated into package 234. The packages 234 are connected through an adhesive 236 and attached to substrate 232 using a similar material 237. Wire bonds 209 electrically connect leadframe 228 to substrate 232.

Figure 29A:
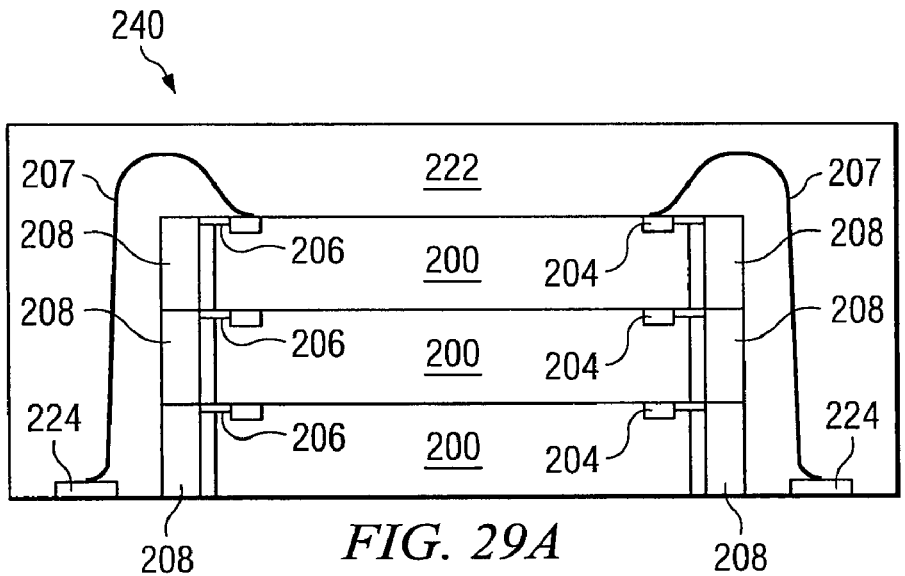
FIG. 29A illustrates an additional embodiment of a semiconductor package incorporating a series of stacked THV dies which are wire-bonded to a bond pad.

FIG. 29A illustrates a package 240, where a set of three THV dies 200, which are wire-bonded on both respective sides to terminal land 224 using wires 207. An encapsulant 222 provides support.

Figure 29B:
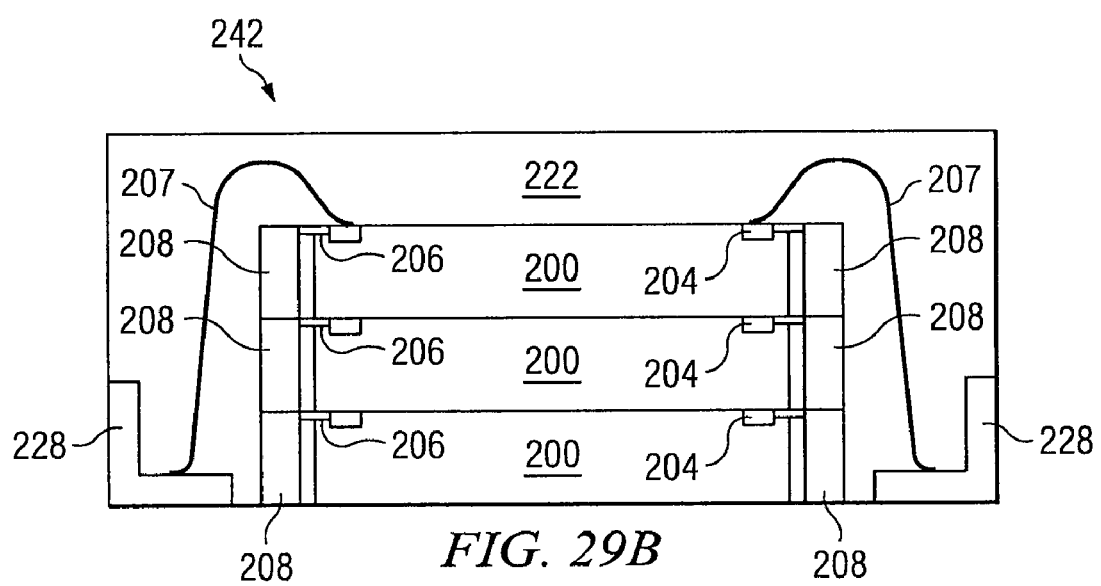
FIG. 29B illustrates a similar embodiment of a semiconductor package shown in FIG. 29A, with the addition of a leadframe structure.

In a similar embodiment, package 242 illustrated in FIG. 29B depicts the addition of a portion of a leadframe structure 228, to which each respective side of THV die 200 is again wire-bonded from the top bond pads 204.

Figure 29C:
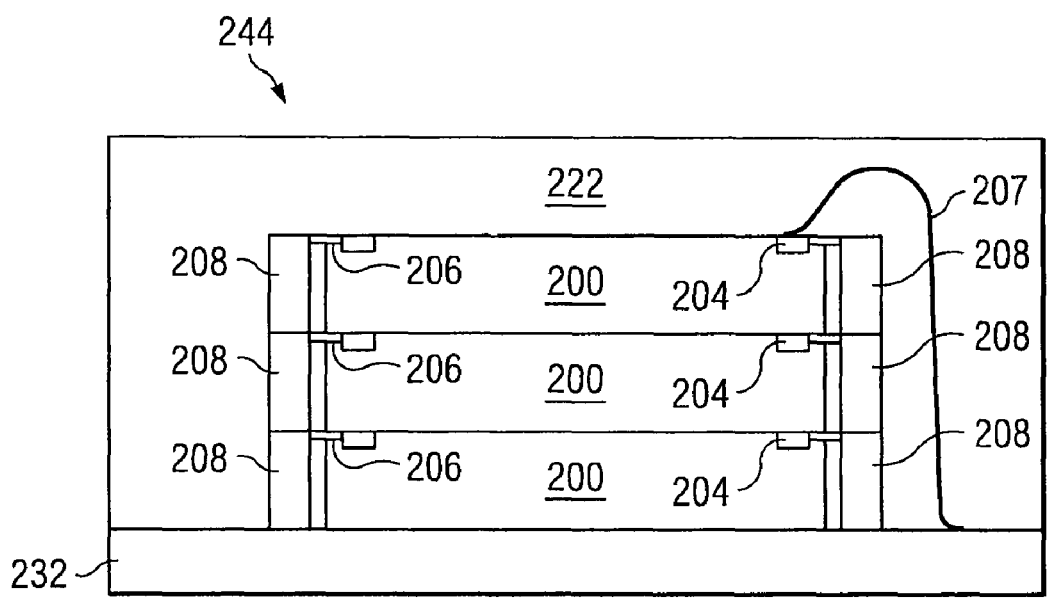
FIG. 29C illustrates a series of stacked THV dies which are wire-bonded to a substrate.
Figure 29D:
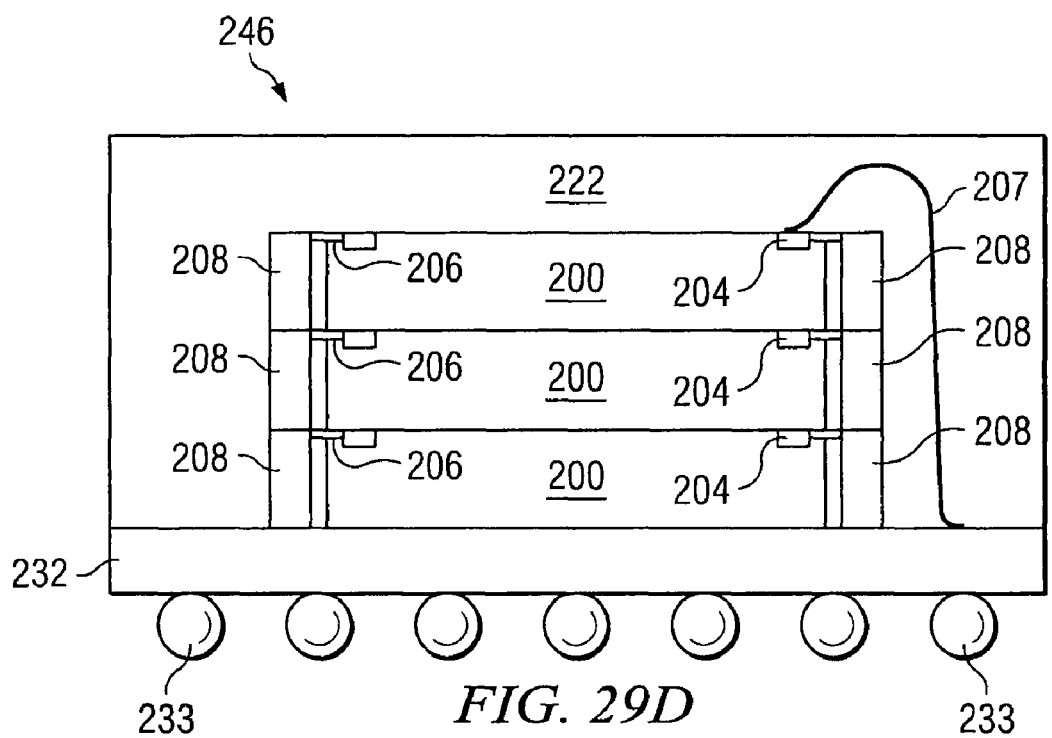
FIG. 29D illustrates a series of stacked THV dies which are wire-bonded to a circuit carrier substrate.

Turning to FIG. 29C, an additional package 244 is depicted where a set of three THV dies 200 are disposed over circuit carrier substrate 232. The top THV die 200 bond pad 204 is wire-bonded using wire 207 directly to circuit carrier substrate 232. In a similar embodiment, package 246 as shown in FIG. 29D incorporates a circuit carrier substrate 232 incorporating a series of bump interconnections 233.

Figure 30:
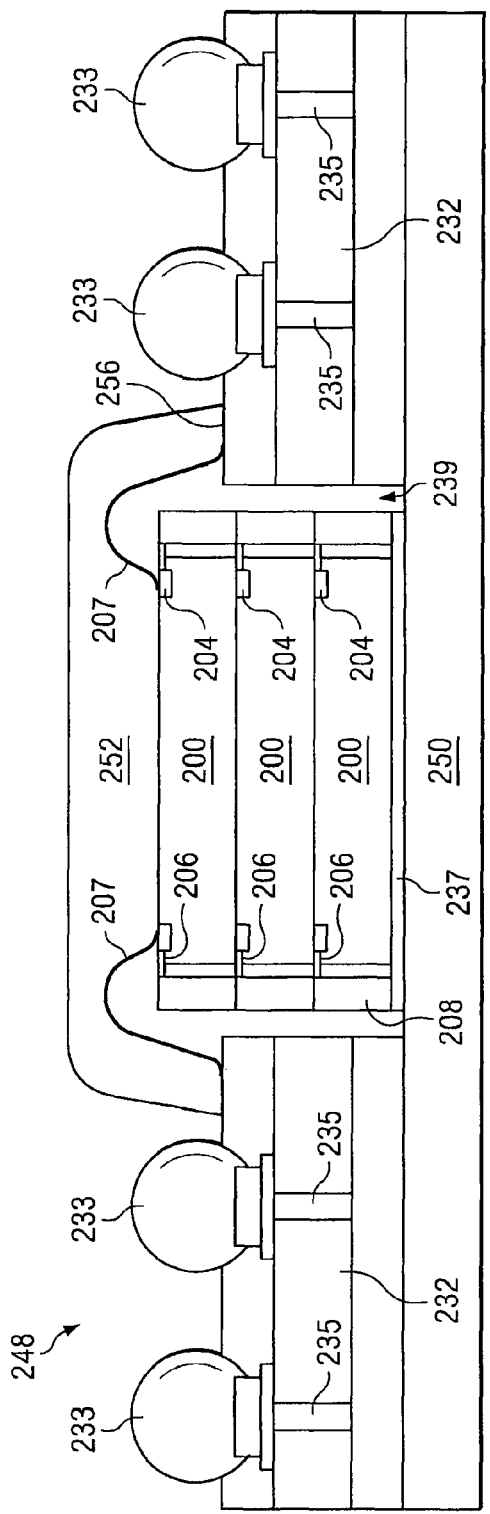
FIG. 30 illustrates a series of stacked THV dies which are integrated into a cavity substrate.

FIG. 30 illustrates the first of two depicted embodiments where a set of THV dies 200 are disposed within a portion of a cavity integrated into a substrate. Package 248 includes a thermal conductive lid 250, where a circuit carrier substrate 232 having interconnection layers 235 is connected to a series of interconnection bumps 233. Cavity 239 is integrated into substrate 232, where a set of three THV dies 200 are mounted using an adhesive material 237 or similar material. The bond pads 204 of the top THV die 200 is wire-bonded to substrate 232 at location 256. An optional encapsulant 252 is formed over a portion of THV dies 200 and cavity 239.

Figure 31:
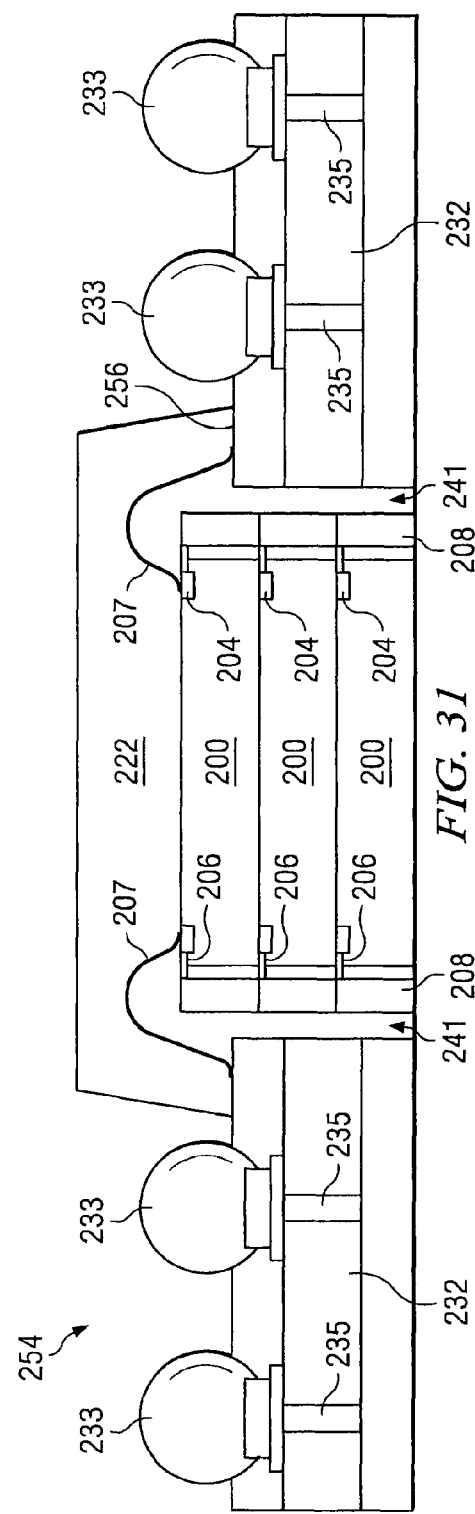
FIG. 31 illustrates a series of stacked THV dies which are integrated into a cavity substrate in a similar embodiment.

FIG. 31 illustrates a package 265 where a series of stacked THV dies 200 are incorporated in an open cavity 241 substrate 232. The substrate again includes interconnection layers 235 and bump interconnections 233. The top THV die 200 is wire-bonded from bond pads 204 directly to circuit carrier substrate 232 at location 256.

Configurations such as those shown in FIGS. 30 and 31 allow the use of same-size THV dies 200, resulting in the benefits of same-size die packaging, as well as incorporating the maximum die size within packages 248 and 254, which conventional dies cannot achieve. Further, packages 248 and 254 can be further used for package-on-package (PoP) stacking implementations.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor package, comprising:
a substrate or leadframe structure;
a plurality of stacked same-size interconnected dies disposed over the substrate or leadframe structure, each die having a top surface, side surface, and bottom surface, the top surface of a first die of the stacked same-size interconnected dies directly contacting the bottom surface of a second die of the stacked same-size interconnect dies, the side surface of each die being surrounded by an organic material having a plurality of conductive through-hole vias (THVs) formed in the organic material extending from a top surface of the organic material to a bottom surface of the organic material, the conductive THVs being exposed from a side surface of the organic material;
a plurality of bond pads formed on the top surface of each of the stacked same-size interconnected dies;
a plurality of conductive traces formed on the top surface of each of the stacked same-size interconnected dies between the bond pads and the conductive THVs; and
an encapsulant formed over a portion of the substrate or leadframe structure and the plurality of stacked same-size interconnected dies.

2. The semiconductor package of claim 1, wherein the first die of the plurality of stacked same-size interconnected dies is wire-bonded to the substrate or leadframe structure.

3. The semiconductor package of claim 2, further including a wire coupled between the substrate or leadframe structure and a terminal land.

4. The semiconductor package of claim 1, further including a conductive lid disposed over a surface of the substrate or leadframe structure.

5. The semiconductor package of claim 4, wherein the first die of the plurality of stacked same-size interconnected dies is attached to the conductive lid using a die attach adhesive material.

6. The semiconductor package of claim 1, wherein the substrate or leadframe structure is bumped to facilitate electrical connectivity.

7. The semiconductor package of claim 1 wherein the plurality of conductive THVs surround the periphery of each die.

8. A semiconductor package, comprising:
a substrate or leadframe structure having an integrated cavity;
a plurality of stacked same-size interconnected dies disposed within the integrated cavity, each die having a top surface, side surface, and bottom surface, the top surface of a first die of the stacked same-size interconnected dies directly contacting the bottom surface of a second die of the stacked same-size interconnect dies, the side surface of each die being surrounded by an organic material having a plurality of conductive through-hole vias (THVs) formed in the organic material extending from a top surface of the organic material to a bottom surface of the organic material, the conductive THVs being exposed from a side surface of the organic material;
a plurality of bond pads formed on the top surface of each of the stacked same-size interconnected dies;
a plurality of conductive traces formed on the top surface of each of the stacked same-size interconnected dies between the bond pads and the conductive THVs;
a bond wire coupled between the second die of the stacked same-size interconnected dies and substrate or leadframe structure; and
an encapsulant formed over a portion of the substrate or leadframe structure and the stacked same-size interconnected dies.

9. The semiconductor package of claim 8, further including a conductive lid disposed over a surface of the substrate or leadframe structure.

10. The semiconductor package of claim 9, wherein the first die of the plurality of stacked same-size interconnected dies is attached to the conductive lid using a die attach adhesive material.

11. The semiconductor package of claim 8, wherein the substrate or leadframe structure is bumped to facilitate electrical connectivity.

12. The semiconductor package of claim 8 wherein the plurality of conductive THVs surround the periphery of each die.

13. A method of manufacturing a semiconductor package, comprising:
providing a substrate or leadframe structure;
providing a plurality of stacked same-size interconnected dies disposed over the substrate or leadframe structure, each die having a top surface, side surface, and bottom surface, the top surface of a first die of the stacked same-size interconnected dies directly contacting the bottom surface of a second die of the stacked same-size interconnect dies, the side surface of each die being surrounded by an organic material having a plurality of conductive through-hole vias (THVs) formed in the organic material extending from a top surface of the organic material to a bottom surface of the organic material, the conductive THVs being exposed from a side surface of the organic material;
forming a plurality of bond pads on the top surface of each of the stacked same-size interconnected dies;
forming a plurality of conductive traces on the top surface of each of the stacked same-size interconnected dies between the bond pads and the conductive THVs; and
depositing an encapsulant formed over a portion of the substrate or leadframe structure and the plurality of dies.

14. The method of manufacture of claim 13, wherein the first die of the plurality of stacked same-size interconnected dies is wire-bonded to the substrate or leadframe structure.

15. The method of manufacture of claim 14, further including forming a wire between the substrate or leadframe structure and a terminal land.

16. The method of manufacture of claim 13, further including disposing a conductive lid over a surface of the substrate or leadframe structure.

17. The method of manufacture of claim 16, further including attaching the first die of the plurality of stacked same-size interconnected dies to the conductive lid using a die attach adhesive material.

18. The method of manufacture of claim 13, wherein the substrate or leadframe structure is bumped to facilitate electrical connectivity.

19. The method of manufacture of claim 13, wherein each of the plurality of stacked same-size interconnected dies has a substantially similar dimensional footprint.

20. The method of claim 13 wherein the plurality of conductive THVs surround the periphery of each die.

21. A method of manufacturing a semiconductor package, comprising:
providing a substrate or leadframe structure having an integrated cavity;
providing a plurality of stacked same-size interconnected dies disposed within the integrated cavity, each die having a top surface, side surface, and bottom surface, the top surface of a first die of the stacked same-size interconnected dies directly contacting the bottom surface of a second die of the stacked same-size interconnect dies, the side surface of each die being surrounded by an organic material having a plurality of conductive through-hole vias (THVs) formed in the organic material extending from a top surface of the organic material to a bottom surface of the organic material, the conductive THVs being exposed from a side surface of the organic material;
forming a plurality of bond pads on the top surface of each of the stacked same-size interconnected dies;

forming a plurality of conductive traces on the top surface of each of the stacked same-size interconnected dies between the bond pads and the conductive THVs;

forming a bond wire between the second die of the stacked same-size interconnected dies and substrate or leadframe structure; and depositing an encapsulant formed over a portion of the substrate or leadframe structure and the plurality of dies.

22. The method of manufacture of claim 21, further including disposing a conductive lid over a surface of the substrate or leadframe structure.

23. The method of manufacture of claim 22, further including attaching the first die of the plurality of interconnected dies to the conductive lid using a die attach adhesive material.

24. The method of manufacture of claim 21, wherein the substrate or leadframe structure is bumped to facilitate electrical connectivity.

25. The method of claim 21 wherein the plurality of conductive THVs surround the periphery of each die.

* * * * *